(12) United States Patent
Pham et al.

(10) Patent No.: US 9,647,133 B2
(45) Date of Patent: May 9, 2017

(54) LOW CONTACT RESISTANCE THIN FILM TRANSISTOR

(71) Applicants: Duy Vu Pham, Oberhausen (DE); Kuo Hui Su, Taipei (TW)

(72) Inventors: Duy Vu Pham, Oberhausen (DE); Kuo Hui Su, Taipei (TW)

(73) Assignee: Evonik Degussa GmbH, Essen (DE)

( * ) Notice: Subject to any disclaimer, the term of this patent is extended or adjusted under 35 U.S.C. 154(b) by 0 days.

(21) Appl. No.: 15/036,662

(22) PCT Filed: Nov. 13, 2014

(86) PCT No.: PCT/EP2014/074447
§ 371 (c)(1),
(2) Date: May 13, 2016

(87) PCT Pub. No.: WO2015/071344
PCT Pub. Date: May 21, 2015

(65) Prior Publication Data
US 2016/0284853 A1 Sep. 29, 2016

(30) Foreign Application Priority Data
Nov. 15, 2013 (EP) .................................... 13193037

(51) Int. Cl.
*H01L 29/04* (2006.01)
*H01L 29/786* (2006.01)
*H01L 29/417* (2006.01)
*H01L 29/45* (2006.01)
*H01L 21/02* (2006.01)
(Continued)

(52) U.S. Cl.
CPC .... *H01L 29/7869* (2013.01); *H01L 21/02271* (2013.01); *H01L 23/3171* (2013.01); *H01L 27/1225* (2013.01); *H01L 29/41733* (2013.01); *H01L 29/45* (2013.01); *H01L 29/66969* (2013.01); *H01L 29/78618* (2013.01)

(58) Field of Classification Search
CPC .................................................. H01L 51/5056
See application file for complete search history.

(56) References Cited

U.S. PATENT DOCUMENTS 6,664,527 B2 * 12/2003 Kobayashi .......... H01L 27/1446
250/208.1
8,338,226 B2  12/2012 Asano et al.
(Continued)

OTHER PUBLICATIONS

International Search Report issued on Jan. 14, 2015 in PCT/EP2014/074447.

*Primary Examiner* — Thao P Le
(74) *Attorney, Agent, or Firm* — Oblon, McClelland, Maier & Neustadt, L.L.P.

(57) ABSTRACT

The present invention relates to a novel thin film transistor (TFT) comprising a substrate (100) with a gate electrode layer (101) deposited and patterned thereon and a gate insulator layer (102) deposited on the gate electrode layer and the substrate, characterized in that the transistor further comprises (i) a carrier injection layer (103) arranged above the gate insulator layer, (ii) a source/drain (S/D) electrode layer (104) deposited on the carrier injection layer, and (iii) a semiconductor layer (106), methods for the production of such novel TFTs, devices comprising such TFTs, and to the use of such TFTs.

28 Claims, 5 Drawing Sheets

Figure 1:
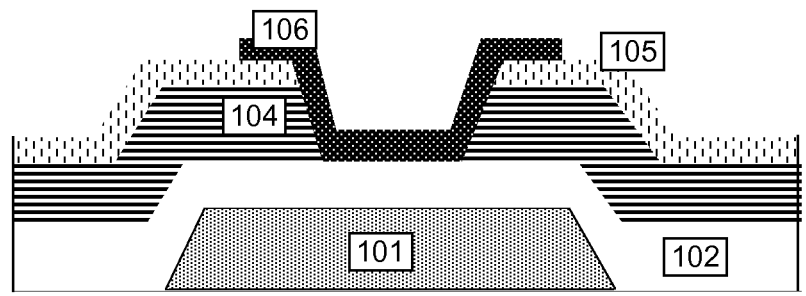

(51) Int. Cl.
    *H01L 23/31*     (2006.01)
    *H01L 27/12*     (2006.01)
    *H01L 29/66*     (2006.01)

(56) References Cited

U.S. PATENT DOCUMENTS

| | | | |
|---|---|---|---|
| 8,405,085 B2 * | 3/2013 | Wu | H01L 29/78621 |
| | | | 257/59 |
| 2007/0024766 A1 * | 2/2007 | Song | H01L 51/102 |
| | | | 349/42 |

* cited by examiner

LOW CONTACT RESISTANCE THIN FILM TRANSISTOR

FIELD OF THE INVENTION

The present invention relates to thin film transistors and electronic devices comprising such thin film transistors and methods for producing the thin film transistors, and to the use of these thin film transistors.

BACKGROUND OF THE INVENTION

As modern information technology advances, various types of displays have been widely used in screens for consumer electronic products such as mobile phones, notebook computers, digital cameras, and personal digital assistants (PDAs). Among these displays, liquid crystal displays (LCD) and organic light-emitting diode display (OLED) are the prevailing products in the market due to their advantages of being light-weight, compact, and low in power-consumption. The manufacturing process for both LCD and OLED includes forming semiconductor devices arranged in array on a substrate and the semiconductor devices include thin film transistors (TFTs). TFTs comprise source-/drain-electrodes, a gate electrode, a dielectric layer, a substrate layer, and an active semiconducting layer.

Here and below, active semiconducting layers are to be understood as meaning layers which have charge carrier mobilities of from 1 to 50 $cm^2/Vs$ in the case of a component having a channel length of 20 μm at 50 V gate source voltage and 50 V source drain voltage.

Conventionally, thin film transistors include top-gate TFTs and bottom-gate TFTs, depending on whether the gate is positioned on the substrate and below the electrodes or vice versa positioned above the electrodes. These TFTs have one semiconductor layer or stack of layers serving as an active layer.

One problem in the field of metal oxide semiconductor thin film transistors is that during fabrication, e.g., due to high temperature treatment of the semiconductor laminate comprised in the TFT, the surface of the source-/drain-electrode layer is unintentionally oxidized which causes deterioration of the laminate's conduction properties, i.e., by causing parasitic resistance.

It is state of the art to introduce a buffer layer between the source-/drain-electrode layer and the active semiconductor layer, wherein the buffer layer is above the S/D-electrode layers and beneath the active semiconductor layer relative to the substrate layer, in order to reduce S/D-electrode layer oxidation (cf. U.S. Pat. No. 8,338,226, U.S. Pat. No. 8,405,085, US20120211746, US20120248446, US20130037797, and US20130056726). U.S. Pat. No. 8,247,276 teaches to introduce a buffer layer between the source-/drain-electrode layer and the active semiconductor layer, wherein the buffer layer is beneath the S/D-electrode layers and above the active semiconductor layer relative to the substrate layer.

However, the resulting semiconductor laminates are still prone to influences on the S/D-electrode layer and thus do not have the desired conductive properties.

It was therefore an object of the present invention to provide a semiconductor laminate which overcomes the above limitations and has improved conductive properties.

The inventors of the present invention found out that due to the procedural steps in laminate alignment, e.g., during a high temperature treatment during the provision of the active oxide semiconductor layer, the buffer layer covered source-/drain-electrode layer is only vertically protected but not protected against horizontal influences which are sufficient to significantly disturb the contact between the side surface of the source-/drain-electrode layer and the active oxide semiconductor layer.

Accordingly, even though the above buffer layer is implemented as a measure to improve protection of the source-/drain-electrode layer, oxidation of this layer occurs at the side surface where it contacts the active oxide semiconductor layer. Thus, the laminate manufacturing process still negatively influences the total conductivity of the laminate by raising the contact resistance. In agreement with this finding, the inventors found that this effect contributes to a reduced on-current of the laminate.

Furthermore, the inventors surprisingly discovered that the above problem is solved by the provision of a carrier injection layer at the bottom of the source-/drain-electrode layer, wherein the active oxide semiconductor layer is in direct contact with the gate insulator layer, the injection layer, and the source-/drain-electrode. Specifically advantageous is, if the active oxide semiconductor is provided on a source-/drain-electrode layer which is deposited on a carrier injection layer and wherein the active oxide semiconductor layer is in direct contact with the gate insulator layer, the injection layer, and the source-/drain-electrode.

The problem may also be solved by the provision of a carrier injection layer at the bottom of the source-/drain-electrode layer, wherein the injection layer is in direct contact with the source-/drain-electrode and the active oxide semiconductor layer is in direct contact with the injection layer via a side surface of the injection layer and in direct contact with the S/D electrode layer via a side surface of the S/D electrode layer.

The injection layer is capable of injecting electrons into the active oxide semiconductor layers.

The TFT laminates have a significantly reduced contact resistance between the source-/drain-electrode layer and the semiconductor layer, leading to an increase in on-current and electron mobility.

In addition, the inventors found that it is further beneficial to combine the above injection layer with a protection layer arranged on the top of the source-/drain-electrode layer to prevent the above mentioned vertical electrode surface oxidation during the laminate annealing process. Thus, the combination of injection and protection layers further improves the conductivity of the laminate and the resulting TFT devices.

SUMMARY OF THE INVENTION

In one aspect, the present invention relates to a thin film transistor (TFT) comprising a substrate (100) with a gate electrode layer (101) deposited and patterned thereon and a gate insulator layer (102) deposited on the gate electrode layer and the substrate, characterized in that the transistor further comprises (i) a carrier injection layer (103) arranged above the gate insulator layer, (ii) a source/drain (S/D) electrode layer (104) deposited on the carrier injection layer, and (iii) a semiconductor layer (106), wherein the TFT is patterned such that the semiconductor layer directly contacts the gate insulator layer, the carrier injection layer and the S/D electrode layer.

In certain embodiments, the semiconductor layer (106) is arranged above the carrier injection layer (103) and the S/D electrode layer (104).

In various embodiments, the TFT is in Bottom Gate and Bottom Contact configuration.

In some embodiments, the carrier injection layer (103) is deposited on the gate insulator layer (102); the TFT further comprises a protection layer (105), wherein the protection layer is deposited on the S/D electrode layer; the TFT further comprises a protection layer (105), wherein the protection layer is deposited on the S/D electrode layer and the semiconductor layer (106) is deposited and patterned on the protection layer; and/or the TFT further comprises a passivation layer (108), wherein the passivation layer is deposited on the semiconductor layer (106). In some embodiments, the TFT may further comprise a functionalization layer (107) deposited on top of the semiconductor layer (106) and located between the semiconductor layer and the passivation layer (108). The functionalization layer has the function to keep the oxygen contents of the semiconductor layer during the passivation process.

In certain embodiments, the semiconductor layer (106) directly contacts a) the gate insulator layer (102), b) a side surface of the carrier injection layer (103), and c) a side surface of the S/D electrode layer (104).

In some embodiments, the semiconductor layer (106) directly contacts a) the gate insulator layer (102), b) a side surface of the carrier injection layer (103), and c) a side surface of the S/D electrode layer (104) and the contact of the semiconductor layer (106) with the side surface of the S/D electrode layer (104) occurs above the contact of the semiconductor layer (106) with the side surface of the carrier injection layer (103).

In certain embodiments, the semiconductor layer (106) is not located underneath the S/D electrode layer (104) or the injection layer (103); the semiconductor layer (106) is in contact with the substrate averted surface of the S/D electrode layer (104) or if the TFT comprises a protection layer (105) the semiconductor layer (106) is in contact with the substrate averted surface of the protection layer; the TFT comprises a protection layer (105), wherein the protection layer is arranged above S/D electrode layer (104); the TFT further comprises a protection layer (105), wherein the protection layer is arranged above S/D electrode layer (104) and wherein the semiconductor layer (106) reaches from the gate insulator layer (102) to above the protection layer; the TFT further comprises a pixel electrode; and/or the TFT comprises a pair of injection layers (103) which are horizontally positioned within the TFT with equal distance relative to the substrate layer (100) and wherein the two injection layers are separated from each other by the semiconductor layer (106) and wherein the TFT comprises a pair of S/D electrode layers (104) which are horizontally positioned within the TFT with equal distance relative to the substrate layer (100) and wherein the two S/D electrode layers (104) are separated from each other by the semiconductor layer (106), and wherein the pair of S/D electrode layers (104) is positioned above and in direct contact with the pair of injection layers (103).

In various embodiments, the S/D electrode layer (104) comprises or consists of a metal, preferably selected from Al, Cu, Ag, and/or Nd or a stack or alloy thereof, more preferably Al or Cu; the S/D electrode layer (104) has a thickness of 10 nm-1 µm, preferably of 100-300 nm; the gate electrode layer (101) comprises or consists of a metal selected from or Al, Ti, Mo, Cu, and/or Nd or a stack or alloy thereof, preferably a stack of Mo/Al/Mo or Ti/Al/Ti; the gate electrode layer (101) has a thickness of 50 nm-500 nm, preferably of 80-400 nm, more preferably of 100-350 nm, most preferably of about 300 nm; the injection layer (103) comprises or consists of a metal oxide conductor; the injection layer (103) has a thickness of 1 nm-200 nm, preferably of 10-150 nm, more preferably of 20-100 nm, most preferably of about 30-90 nm; the gate insulator layer (102) comprises or consists of a metal oxide or -nitride or transition metal oxide or -nitride, in particular silicon dioxide ($SiO_x$) and/or -nitride ($SiN_x$), aluminum oxide, hafnium oxide, or titan oxide, a polymeric material, e.g. organic or inorganic polymer or a mixture or stack thereof; the gate insulator layer (102) has a thickness of 10 nm-3 µm, preferably of 50-1000 nm, more preferably of 100-500 nm, most preferably of about 300 nm; the substrate (100) comprises glass, silicon, silicon dioxide, metal oxide, transition metal oxide, elementary metal or a polymeric material, e.g. polyimide (PI), polyethylene terephthalate (PET), polymethyl methacrylate (PMMA), or polycarbonate or a hybrid of inorganic and organic components, in particular silicone oxide and polyimide; the substrate (100) optionally has a thickness of 50 µm-0.7 mm; the semiconductor layer (106) comprises at least one metal oxide selected from the group consisting of an indium, gallium, zinc, and/or tin oxide; and/or the semiconductor layer (106) has a thickness of 1-100 nm, preferably of 5-30 nm.

In some embodiments, the S/D electrode layer (104) essentially consist of a metal selected from the group consisting of Al, Cu, Ag or Nd or a stack or alloy thereof, preferably Al or Cu; the gate electrode layer (101) essentially consist a metal selected from the group consisting of Al, Mo, Cu, or Nd or a stack or alloy thereof, preferably a stack of Mo/Al/Mo or Ti/Al/Ti the carrier injection layer (103) essentially consists of a metal oxide conductor selected from the group consisting of indium tin oxide (ITO), aluminum-doped zinc oxide (AZO), gallium-doped zinc oxide (GZO), antimony tin oxide (ATO), zinc tin oxide (ZTO), indium zinc oxide (IZO), indium gallium oxide (IGO), aluminum zinc tin oxide (AZTO), hafnium indium zinc oxide (HIZO), gallium tin zinc oxide (GTZO), gallium tin oxide (GTO), and fluorine-doped tin oxide FTO, preferably ITO, AZO, ATO, and FTO, more preferably ITO and AZO; the semiconductor layer (106) consists essentially of a metal oxide semiconductor selected from the group consisting of indium gallium zinc oxide (IGZO), indium tin zinc oxide (ITZO), ITO, GZO, ZTO, IZO, IGO, AZO, AZTO, HIZO, GTZO, GTO, tin oxide ($SnO_2$), gallium oxide ($Ga_2O_3$), indium oxide ($In_2O_3$), and zinc oxide (ZnO); and/or the semiconductor layer (106) further comprises nitrogen, fluorine, chlorine, and/or silicon.

In certain embodiments, the semiconductor laminate further comprises a pixel electrode.

In various embodiments, the protection layer (105) comprises or consists essentially of a metal oxide conductor, preferably selected from the group consisting of ITO, AZO, GZO, ATO, ZTO, IZO, IGO, AZTO, HIZO, GTZO, GTO, and FTO, preferably ITO, AZO, ATO, and FTO, more preferably ITO and AZO, or a metal, preferably selected from Mo, Ti, Ta, and Cr, preferably Mo, and Ti; the protection layer (105) has a thickness of 10-500 nm, preferably of 20-300 nm, more preferably of 50-100 nm; the passivation layer (108) comprises $SiO_x$ or $SiN_x$ with x=0.1 to 3;

In another aspect, the present invention relates to a method of manufacture of a TFT comprising the steps of: providing a substrate (100); depositing and patterning a gate electrode (101) on the substrate (100); depositing a gate insulator layer (102) on the gate electrode (101) and the substrate (100); characterized in that the method further comprises providing a carrier injection layer (103) arranged above the gate insulator layer (102), providing a S/D electrode layer (104) deposited on the carrier injection layer (103), and providing a semiconductor layer (106), wherein the TFT is patterned such that the semiconductor layer directly contacts the gate insulator layer (102), the carrier injection layer (103), and the S/D electrode layer (104).

In certain embodiments, the semiconductor layer (106) is arranged above the carrier injection layer (103) and the S/D electrode layer (104).

In various embodiments, the TFT is in Bottom Gate and Bottom Contact configuration.

In some embodiments, the provision of the carrier injection layer (103) comprises depositing the carrier injection layer (103) on the gate insulator layer (102); the method further comprises providing a protection layer (105), wherein the protection layer is deposited on the S/D electrode layer; the method further comprises providing a protection layer (105), wherein the protection layer is deposited on the S/D electrode layer and the semiconductor layer (106) is deposited and patterned on the protection layer; and/or the method further comprises providing a passivation layer (108), wherein the passivation layer is deposited on the semiconductor layer (106). In some embodiments, the method further comprises providing a functionalization layer (107), wherein the functionalization layer is deposited on the semiconductor layer (106) before the passivation layer (108) is deposited thereon so that the functionalization layer is located between the semiconductor layer (106) and the passivation layer (108).

In some embodiments, the semiconductor layer (106) is provided such that it directly contacts a) the gate insulator layer (102), b) a side surface of the carrier injection layer (103), and c) a side surface of the S/D electrode layer (104).

In certain embodiments, the semiconductor layer (106) is provided such that the contact of the semiconductor layer (106) with the side surface of the S/D electrode layer (104) occurs above the contact of the semiconductor layer (106) with the side surface of the carrier injection layer (103).

In various embodiments, the semiconductor layer (106) is provided such that the semiconductor layer (106) is not located underneath the S/D electrode layer (104) or the injection layer (103); the semiconductor layer (106) is provided such that the semiconductor layer (106) is in contact with the substrate averted surface of the S/D electrode layer (104) or if the TFT comprises a protection layer (105) the semiconductor layer (106) is in contact with the substrate averted surface of the protection layer; the TFT comprises a protection layer (105), wherein the protection layer is arranged above S/D electrode layer (104); the TFT further comprises a protection layer (105), wherein the protection layer is arranged above S/D electrode layer (104) and wherein the semiconductor layer (106) is provided such that the semiconductor layer (106) reaches from the gate insulator layer (102) to above the protection layer; the method further comprises providing through hole; and/or the method further comprises providing a pixel electrode.

In some embodiments, depositing and patterning of the gate electrode comprises photolithography and an etching process or another suitable patterning techniques, including but not limited to photo-patterning, printing, including inkjet printing, laser patterning and the like; depositing the gate insulator layer on the gate electrode and the substrate comprises chemical vapor deposition (CVD); the provision of the carrier injection layer (103) comprises sputtering of the carrier injection layer (103); the deposition of the S/D electrode layer (104) on the carrier injection layer (103) comprises sputtering of the S/D electrode layer (103); patterning of the TFT comprises photolithography and etching of the injection layer (103) and S/D electrode layer (104) in one step; the provision of the semiconductor layer (106) comprises depositing of the semiconductor layer via sputtering, spin coating, or slot die coating; the provision of the semiconductor layer (106) comprises patterning of the semiconductor layer (106) via photolithography and etching; the deposition of the passivation layer (108) and optionally the functionalization layer may comprise coating via CVD; the through hole is formed by photolithography and etching; the provision of the pixel electrode comprises deposition of the pixel electrode by sputtering; and/or the provision of the pixel electrode comprises patterning of the deposited pixel electrode by photolithography and etching.

In certain embodiments, providing of the injection layer (103) and the S/D electrode layer (104) comprises patterning of the injection layer (103) and S/D electrode layer (104) by photolithography and etching resulting in the formation of a pair of injection layers and a pair of S/D electrode layers.

In some embodiments, the method comprises the provision of the protection layer (105) and providing of the injection layer (103), the S/D electrode layer (104), and the protection layer (105) comprises patterning of the injection layer (103), S/D electrode layer (104), and protection layer (105) by photolithography and etching resulting in the formation of a pair of injection layers, a pair of S/D electrode layers, and a pair of protection layers (105).

In various embodiments, providing the semiconductor layer (106) comprises depositing the semiconductor layer (106) such that the pair of injection layers is separated from each other by the semiconductor layer (106) and the pair of S/D electrode layers (104) is separated from each other by the semiconductor layer (106), and wherein the pair of S/D electrode layers (104) is positioned above and in direct contact with the pair of injection layers (103); or providing the semiconductor layer (106) comprises depositing the semiconductor layer (106) such that the pair of injection layers is separated from each other by the semiconductor layer (106), that the pair of S/D electrode layers (104) is separated from each other by the semiconductor layer (106), and that the pair of protection layers (105) is separated from each other by the semiconductor layer (106), and wherein the pair of protection layers (105) is positioned above and in direct contact with the pair of S/D electrode layers (104), and the pair of S/D electrode layers (104) is positioned above and in direct contact with the pair of injection layers (103).

In some embodiments, the etching process to obtain the gate electrode layer (101), the pair of electrodes (104), the pair of injection layers (104), and the pair of protection layers (105) is either dry or wet etching; the etching process to obtain the semiconductor layer (106) and the pixel electrode layer is wet etching; and/or the etching process to form the through hole is dry etching.

In certain embodiments, the S/D electrode layer or pair of S/D electrode layers (104) comprises or consists of a metal, preferably selected from Al, Cu, Ag, and/or Nd or a stack or alloy thereof, more preferably Al and Cu; the S/D electrode layer or pair of S/D electrode layers (104) has a thickness of 10-500 nm, preferably 100-300 nm; the gate electrode layer (101) comprises or consists of a metal, preferably selected from Al, Ti, Mo, Cu, and Nd or a stack or alloy thereof, more preferably a stack of Mo/Al/Mo or Ti/Al/Ti; the gate electrode layer (101) has a thickness of 50 nm-500 nm, preferably of 80-400 nm, more preferably of 100-350 nm, most preferably of about 300 nm; the injection layer or pair of injection layers (103) comprises or consists of a metal oxide conductor; the injection layer or pair of injection layers (103) has a thickness of 1-200 nm, preferably 20-100 nm;

the gate insulator layer (102) comprises or consists of a metal or transition metal oxide, in particular silicon dioxide and/or -nitride, aluminum oxide, hafnium oxide titan oxide, or titan oxide, a polymeric material, e.g. organic or inorganic polymer; the gate insulator layer (102) 10 nm-3 µm, preferably of 50-1000 nm, more preferably of 100-500 nm, most preferably of about 300 nm; the substrate layer (100) comprises glass, silicon, silicon dioxide, metal oxide, transition metal oxide, elementary metal or a polymeric material, e.g. polyimide (PI), polyethylene terephthalate (PET), polymethyl methacrylate (PMMA) or polycarbonate and a hybrid of inorganic and organic components, in particular silicone oxide and polyimide; the substrate layer (100) optionally has a thickness of 50 µm-0.7 mm; the semiconductor layer (106) comprises at least one metal oxide selected from the group consisting of an indium, gallium, zinc, and/or tin oxide; the semiconductor layer (106) has a thickness 1-200 nm, preferably 1-100 nm, more preferably, 1-50 nm, most preferably about 10 nm; the protection layer or pair of protection layers (105) comprises or consists of a metal oxide conductor, and/or metal, preferably selected from Mo, Ti, Ta, and Cr, more preferably Mo and Ti; and/or the protection layer or pair of protection layers (105) has a thickness of 1 nm-5 µm, preferably 5-100 nm.

In certain embodiments, the S/D electrode layer or pair of S/D electrode layers (104) essentially consists of a metal, preferably Al, Cu, Ag, and/or Nd or a stack or alloy thereof, preferably Al and/or Cu; the gate electrode (101) essentially consists of a metal selected from the group consisting of Al, Mo, Cu, Ti, or Nd, preferably a stack of Mo/Al/Mo or Ti/Al/Ti; the injection layer or pair of injection layers (103) essentially consists of a metal oxide conductor essentially consisting of ITO, AZO, GZO, ATO, ZTO, IZO, IGO, AZTO, HIZO, GTZO, GTO, or FTO, preferably ITO, AZO, ATO, or FTO, more preferably ITO or AZO; the semiconductor layer (106) consists essentially of a metal oxide semiconductor selected from the group consisting of IGZO, ITZO, ITO, GZO, ZTO, IZO, IGO, AZO, AZTO, HIZO, GTZO, GTO, tin oxide (SnO$_2$), gallium oxide (Ga$_2$O$_3$), indium oxide (In$_2$O$_3$), and zinc oxide (ZnO); the semiconductor layer (106) further comprises nitrogen, fluorine, chlorine, and/or silicon; and/or the protection layer or pair of protection layers (105) essentially consists of a metal selected from the group consisting of Mo, Ti, Ta, and Cr, preferably Mo and Ti, or a metal oxide conductor selected from the group consisting of ITO, AZO, GZO, ATO, ZTO, IZO, IGO, AZTO, HIZO, GTZO, GTO, FTO, preferably ITO, AZO, ATO, FTO, more preferably ITO, AZO.

In a further aspect, the present invention relates to an electronic device comprising a TFT as disclosed herein or a TFT obtained from a method as disclosed herein.

In certain embodiments, the electronic device is an active matrix back plane for displays, OLED, LCD, EPD, sensor, TFT screen, RFID chip, or solar cell.

In another aspect, the present invention relates to the use of a TFT as disclosed herein or a TFT obtained from a method as disclosed herein for an electronic device.

In various embodiments, the electronic device is an active matrix back plane for displays, OLED, LCD, EPD, sensor, TFT screen, RFID chip, or solar cell.

The scope of the invention is further defined by the appended claims.

FIGURE LEGENDS

FIG. 1 shows a semiconductor laminate which is typically comprised in the TFTs of the prior art. For simplicity, the substrate layer (100) is not shown. The laminate comprises a gate electrode layer (101), a gate insulator layer (102), a pair of S/D electrode layers (104), a pair of protection layers (105), and a semiconductor layer (106).

Figure 2:
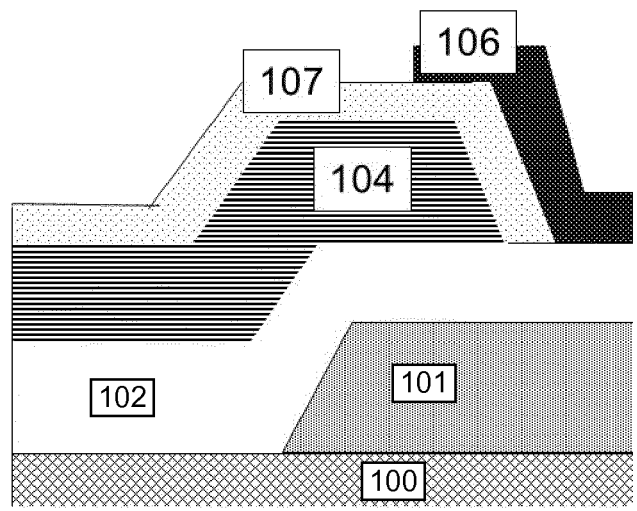

FIG. 2 shows a semiconductor laminate according to the prior art. The laminate comprises a substrate layer (100), a gate electrode layer (101), a gate insulator layer (102), an S/D electrode layer (104), an oxide layer (107), and a semiconductor layer (106). Due to, e.g., high manufacturing temperatures during laminate annealing, a part of the conductive layer may be oxidized to form. Accordingly, the S/D electrode layer (104) which forms the electrode may lose the efficient direct contact with the semiconductor layer (106). This deteriorates the conductive abilities of the semiconductor laminate, in particular regarding the on-current.

Figure 3:
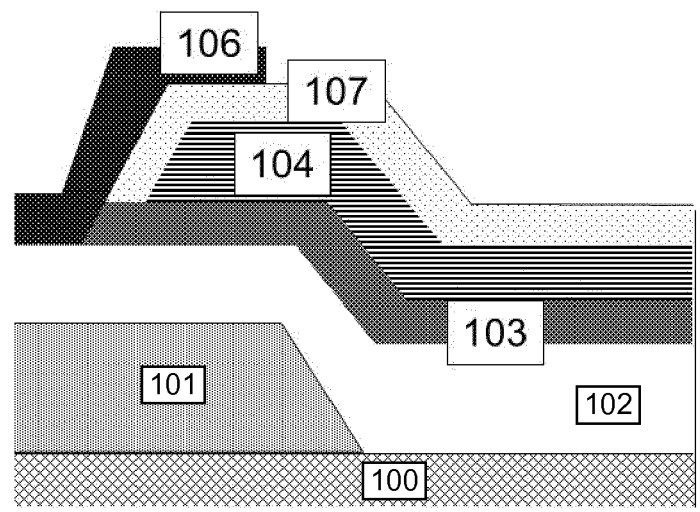

FIG. 3 shows a TFT according to the present invention comprising a substrate layer (100), a gate electrode layer (101), a gate insulator layer (102), an injection layer (103), an S/D electrode layer (104), an oxidized layer (107) at the surface of the electrode layer, and a semiconductor layer (106). Due to the presence of injection layer (103) even in presence of the oxide layer (107), an efficient current transport is possible through the laminate, as injection layer (103) mediates the contact between the electrode layer (104) and the semiconductor layer (106).

Figure 4:
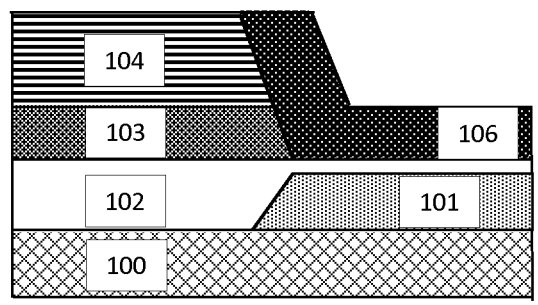

FIG. 4 shows a TFT of the present invention comprising a substrate layer (100), a gate electrode layer (101), a gate insulator layer (102), an injection layer (103), an S/D electrode layer (104), and a semiconductor layer (106). The TFT is patterned such that the semiconductor layer (106) directly contacts the gate insulator layer (102), the carrier injection layer (103) and the S/D electrode layer (104). Specifically, the semiconductor layer (106) is in direct contact with a) the gate insulator layer (102), b) the side surface of the injection layer (103), and c) the side surface of the S/D electrode layer (104). In this embodiment, the contact between the side surface of the injection layer (103) and the semiconductor layer (106) occurs below the contact between the side surface of the S/D electrode layer (104) and the semiconductor layer (106), wherein the substrate layer (100) defines the bottom of the TFT. In this embodiment, the semiconductor layer (106) does not contact the substrate averted surface of the S/D electrode layer (104).

Figure 5:
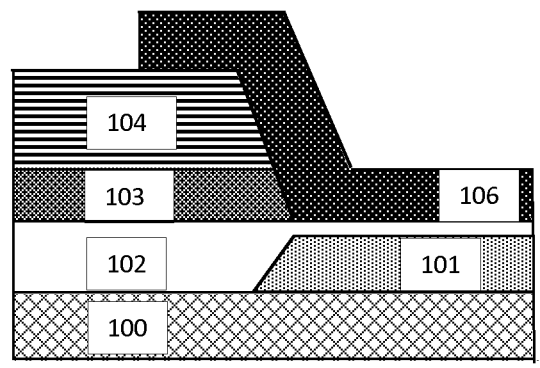

FIG. 5 shows a TFT of the present invention comprising a substrate layer (100), a gate electrode layer (101), a gate insulator layer (102), an injection layer (103), an S/D electrode layer (104), and a semiconductor layer (106). The TFT is patterned such that the semiconductor layer (106) directly contacts the gate insulator layer (102), the carrier injection layer (103) and the S/D electrode layer (104). Specifically, the semiconductor layer (106) is in direct contact with a) the gate insulator layer (102), b) the side surface of the injection layer (103), and c) the side surface of the S/D electrode layer (104). In this embodiment, the contact between the side surface of the injection layer (103) and the semiconductor layer (106) occurs below the contact between the side surface of the S/D electrode layer (104) and the semiconductor layer (106), wherein the substrate layer (100) defines the bottom of the TFT. In this embodiment, the semiconductor layer (106) contacts the substrate averted surface of the S/D electrode layer (104) and proceeds from above the gate insulator layer (102), across the side surfaces of the injection layer (103) and the S/D electrode layer (104), to the substrate averted surface of the S/D electrode layer (104).

Figure 6:
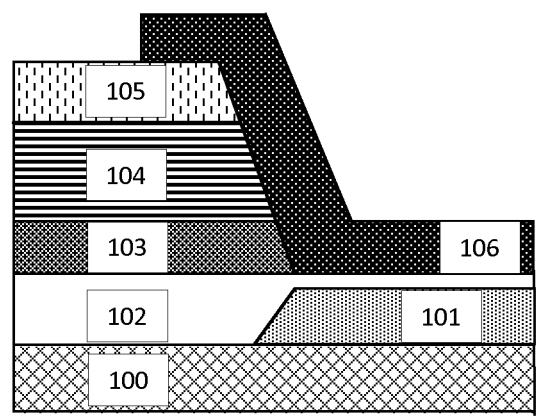

FIG. 6 shows a TFT of the present invention comprising a substrate layer (100), a gate electrode layer (101), a gate insulator layer (102), an injection layer (103), an S/D electrode layer (104), a protection layer (105), and a semiconductor layer (106). The TFT is patterned such that the semiconductor layer (106) directly contacts the gate insulator layer (102), the carrier injection layer (103) and the S/D electrode layer (104). Specifically, the semiconductor layer (106) is in direct contact with a) the gate insulator layer (102), b) the side surface of the injection layer (103), and c) the side surface of the S/D electrode layer (104). In this embodiment, the contact between the side surface of the injection layer (103) and the semiconductor layer (106) occurs below the contact between the side surface of the S/D electrode layer (104) and the semiconductor layer (106), wherein the substrate layer (100) defines the bottom of the TFT. In this embodiment, the semiconductor layer (106) contacts the substrate averted surface of the protection layer (105) and proceeds from above the gate insulator layer (102), across the side surfaces of the injection layer (103), the S/D electrode layer (104), and the protection layer (105) to the substrate averted surface of the protection layer (105).

Figure 7:
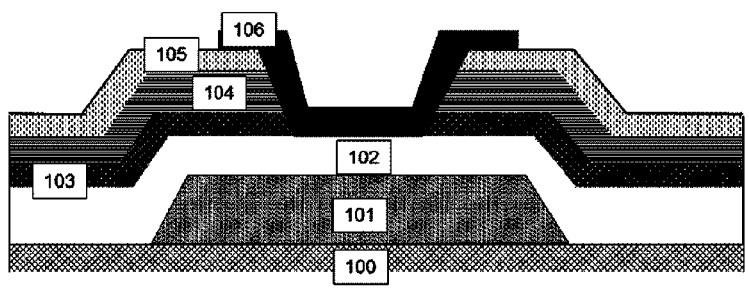

FIG. 7 shows a TFT of the present invention comprising a substrate layer (100), a gate electrode layer (101), a gate insulator layer (102), a pair of injection layers (103), a pair of S/D electrode layers (104), a pair of protection layers (105), and a semiconductor layer (106). The TFT is patterned such that the semiconductor layer (106) directly contacts the gate insulator layer (102), the carrier injection layer (103) and the S/D electrode layer (104). In this embodiment, the contact between the side surfaces of the pair of injection layers (103) and the semiconductor layer (106) occurs below the contact between the side surfaces of the pair of S/D electrode layers (104) and the semiconductor layer (106), wherein the substrate layer (100) defines the bottom of the TFT. In this embodiment, the semiconductor layer (106) contacts the substrate averted surface of the pair of protection layers (105) and proceeds from above the gate insulator layer (102), across the side surfaces of the pair of injection layers (103), the pair of S/D electrode layers (104), and the pair of protection layers (105) to the substrate averted surface of the pair of protection layers (105).

Figure 8:
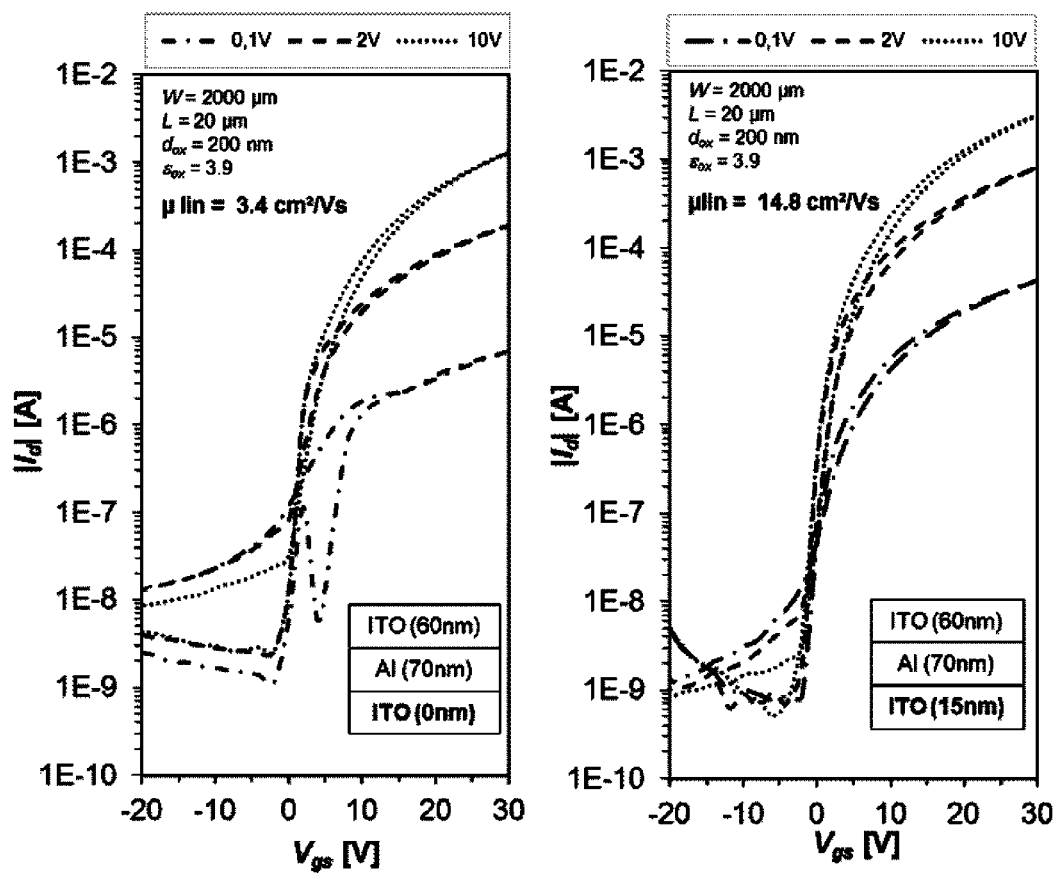

FIG. 8 shows the results of a comparative experiment analyzing the on-current of two different thin film configurations. Configuration a), cf. left panel, shows the results corresponding to a TFT configuration according to the prior art, whereas b), cf. right panel, shows the results corresponding to a TFT configuration according to the present invention including a pair of injection layers beneath the S/D electrode layers. It can be seen from the figure that the TFT with configuration b) has a higher on-current and higher electron mobility than the TFT having configuration a).

Figure 9:
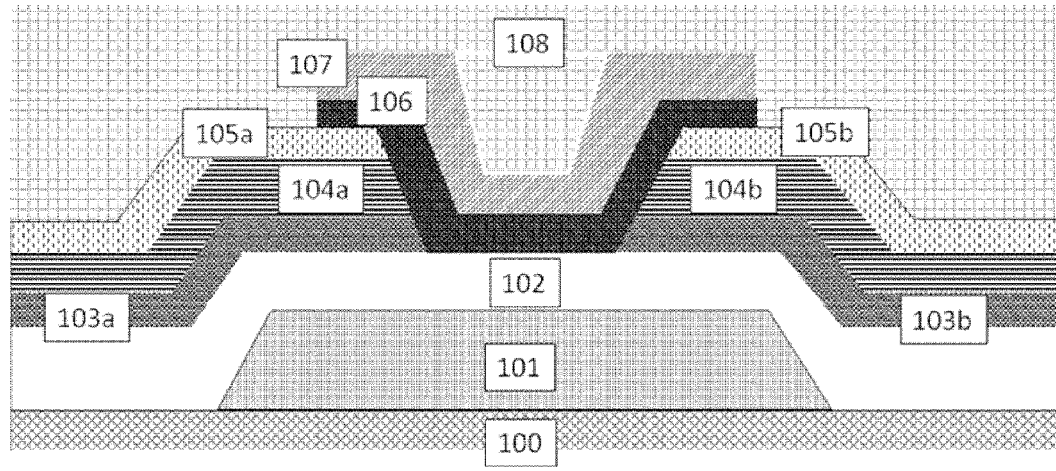

FIG. 9 shows a TFT of the present invention in bottom gate bottom contact configuration (BGBC) comprising a substrate layer (100), a gate electrode layer (101), a gate insulator layer (102), a pair of injection layers (103a, 103b), a pair of S/D electrode layers (104a, 104b), a pair of protection layers (105a, 105b), a semiconductor layer (106), a functionalization layer (107) and a passivation layer (108). The TFT is patterned such that the semiconductor layer (106) directly contacts the gate insulator layer (102), the carrier injection layer (103) and the S/D electrode layer (104). In this embodiment, the contact between the side surfaces of the pair of injection layers (103) and the semiconductor layer (106) occurs below the contact between the side surfaces of the pair of S/D electrode layers (104) and the semiconductor layer (106), wherein the substrate layer (100) defines the bottom of the TFT. In this embodiment, the semiconductor layer (106) contacts the substrate averted surface of the pair of protection layers (105) and proceeds from above the gate insulator layer (102), across the side surfaces of the pair of injection layers (103), the pair of S/D electrode layers (104), and the pair of protection layers (105) to the substrate averted surface of the pair of protection layers (105). The functionalization layer (107) is deposited on top of the semiconductor layer and the passivation layer (108) on top of the functionalization layer (107) and the protection layers (105a, 105b).

Figure 10:
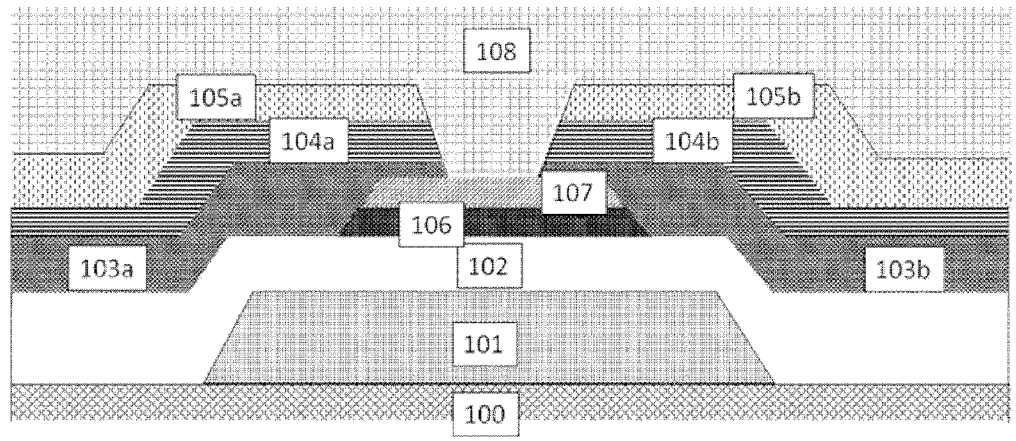

FIG. 10 shows a TFT of the present invention in bottom gate top contact configuration (BCE1) comprising a substrate layer (100), a gate electrode layer (101), a gate insulator layer (102), a pair of injection layers (103a, 103b), a pair of S/D electrode layers (104a, 104b), a pair of protection layers (105a, 105b), a semiconductor layer (106), a functionalization layer (107) and a passivation layer (108). The TFT is patterned such that the semiconductor layer (106) directly contacts the gate insulator layer (102), the carrier injection layers (103a, 103b) and the functionalization layer (107). In this embodiment, the contact between the side surfaces of the pair of injection layers (103a, 103b) and the semiconductor layer (106) occurs below the contact between the side surfaces of functionalization layer (107) and the pair of injection layers (103a, 103b), wherein the substrate layer (100) defines the bottom of the TFT. In this embodiment, the semiconductor layer (106) is only deposited on the gate insulator layer and does only contact the injection layers (103a, 103b) and the functionalization layer (107). The functionalization layer (107) is deposited on top of the semiconductor layer and the passivation layer (108) on top of the functionalization layer (107) and the patterned protection layers (105a, 105b) such that the passivation layer contacts the protection layers (105a, 105b), the side surfaces of the S/D electrode layers (104a, 104b), the side surfaces of the injection layers (103a, 103b) and the top of the functionalization layer (107).

Figure 11:
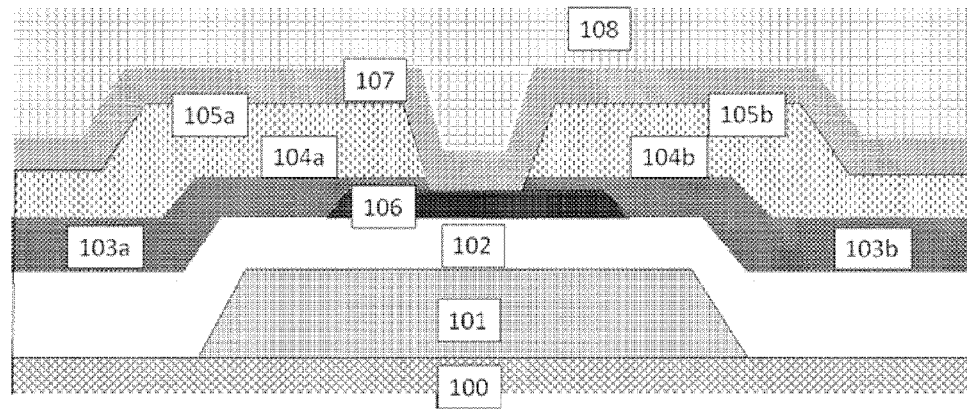

FIG. 11 shows a TFT of the present invention in bottom gate top contact configuration (BCE2) comprising a substrate layer (100), a gate electrode layer (101), a gate insulator layer (102), a pair of injection layers (103a, 103b), a pair of S/D electrode layers (104a, 104b), a pair of protection layers (105a, 105b), a semiconductor layer (106), a functionalization layer (107) and a passivation layer (108). The TFT is patterned such that the semiconductor layer (106) directly contacts the gate insulator layer (102), the carrier injection layers (103a, 103b) and the functionalization layer (107). In this embodiment, the contact between the side surfaces of the pair of injection layers (103a, 103b) and the semiconductor layer (106) occurs below the contact between the side surfaces of functionalization layer (107) and the pair of injection layers (103a, 103b), wherein the substrate layer (100) defines the bottom of the TFT. In this embodiment, the functionalization layer (107) contacts the substrate averted surface of the pair of protection layers (105a, 105b) and proceeds from above the semiconductor layer (106), across the side surfaces of the pair of injection layers (103a, 103b), the pair of S/D electrode layers (104a, 104b), and the pair of protection layers (105a, 105b) to the substrate averted surface of the pair of protection layers (105). In this embodiment, the semiconductor layer (106) is only deposited on the gate insulator layer and does only contact the injection layers (103a, 103b) and the functionalization layer (107). The functionalization layer (107) is deposited on top of the semiconductor layer (106) and the protection layers (105a, 105b) and the passivation layer (108) on top of the functionalization layer (107) and the patterned protection layers (105a, 105b).

Figure 12:
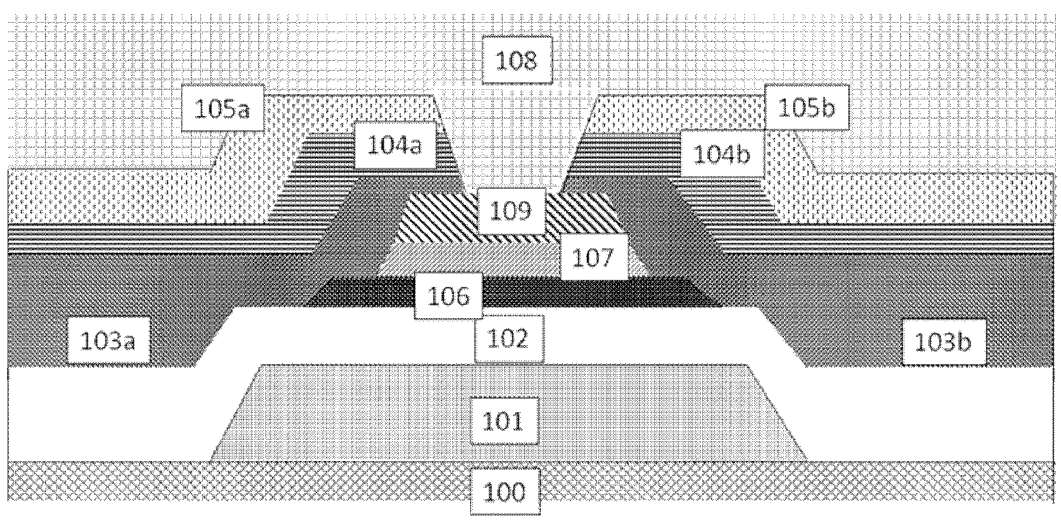

FIG. 12 shows a TFT of the present invention in bottom gate top contact configuration (ESL) comprising a substrate layer (100), a gate electrode layer (101), a gate insulator layer (102), a pair of injection layers (103a, 103b), a pair of S/D electrode layers (104a, 104b), a pair of protection layers (105a, 105b), a semiconductor layer (106), a functionalization layer (107), a passivation layer (108) and an etching stop layer. The configuration is similar to that shown in FIG. 10 with the difference lying the presence of the ESL (109) on top of the functionalization layer (107).

DETAILED DESCRIPTION OF THE INVENTION

As mentioned above, it was an object of the present invention to provide improved TFT laminates which conductive properties are not hampered by the laminate production process and are more stable.

Typical assemblies of known TFT laminates can be illustrated as shown in FIG. 1. Therein, on a substrate layer (not shown) the gate electrode layer (101) is arranged, which is covered by the gate insulator layer (102). Thereon, an S/D electrode layer (104) and a buffer layer (105) are provided. During the patterning process a pair of S/D electrode layers (104) and a pair of buffer layers (105) may be are formed. A semiconductor layer (106) is provided on this assembly reaching from above one member of the pair of buffer layers to the above of other member thereby filling the gap between both pairs of layers. In this configuration, each member of the pair of layers (104) and (105) contacts the semiconductor layer (106) with a side surface.

During the assembly process, for example due to high temperature treatment, the S/D electrode layer (104) may be deteriorated such that a part of this layer forms layer (107), which has lower conductivity than original layer (104). Layer (107) may be oxidized S/D electrode layer. This layer 107 may stretch over the whole contact surface between S/D electrode layer (104) and the semiconductor layer (106) and thereby increase the contact resistance between the S/D electrode layer (104) and the semiconductor layer (106).

FIG. 2 shows a TFT laminate of the prior art, resembling the laminate of FIG. 1 with the exception that buffer layer (105) is absent. Under these circumstances, the above-mentioned layer (107) may be stretched across the whole substrate averted surface of the S/D electrode layer (104), also reaching the interface between S/D electrode layer (104) and the semiconductor layer (106). Under these circumstances, the contact resistance between the S/D electrode layer (104) and the semiconductor layer (106) is increased due to the presence of layer (107).

The inventors surprisingly found that the problem of contact resistance between S/D electrode layer (104) and the semiconductor layer (106) is solved by providing a carrier injection layer (103) at the bottom of the source-/drain-electrode layer (104), wherein the semiconductor layer (106) is in direct contact with the gate insulator layer (102), the injection layer (103), and the S/D electrode layer (104).

In one aspect, the present invention thus relates to a thin film transistor (TFT) comprising a substrate (100) with a gate electrode layer (101) deposited and patterned thereon and a gate insulator layer (102) deposited on the gate electrode layer and the substrate, characterized in that the TFT further comprises (i) a carrier injection layer (103) arranged above the gate insulator layer, (ii) a source/drain (S/D) electrode layer (104) deposited on the carrier injection layer, and (iii) a semiconductor layer (106), wherein the TFT is patterned such that the semiconductor layer directly contacts the gate insulator layer, the carrier injection layer and the S/D electrode layer.

The term "thin film transistor (TFT)" according to present invention refers to a semiconductor laminate which comprises at least 6 layers, namely at least a semiconductor layer (106), a gate electrode layer (101), a gate insulator layer (102), an injection layer (103), S/D electrode layer (104), and a substrate layer (100). In certain embodiments, it further comprises a protection layer, through hole, and pixel electrode.

The term "arranged above" refers to the position of a certain layer within the TFT laminate and means that a $1^{st}$ layer is above of a $2^{nd}$ layer within the TFT if its distance to the substrate layer is larger than the distance of the $2^{nd}$ layer to the substrate layer, wherein the $1^{st}$ and the $2^{nd}$ layer have to same orientation relative to the substrate layer. Furthermore, the term comprises layer arrangements, wherein the $1^{st}$ layer is arranged directly above the $2^{nd}$ layer, meaning that the two layers directly contact each other, or that the $1^{st}$ layer and the $2^{nd}$ layer separated from each other by at least one or more further layers.

The term "deposited on" in the context of a layer means that a $1^{st}$ layer is arranged above a $2^{nd}$ layer, wherein the $1^{st}$ and the $2^{nd}$ layer are direct contact with each other.

The term "in direct contact" or "directly contacting" means that a certain layer directly contacts another layer excluding the possibility that a third layer is positioned between the two layers. Also comprised by this term is a direct contact involving several injection layers being in direct contact with each other and/or several semiconductor layers being in direct contact with each other resulting in a direct contact between the injection layers and semiconductor layers. In certain embodiments, a direct contact between two layers allows current conductance between the two layers.

The term "patterning" means in the context of the present invention manipulating the structure of one or more layers or of the entire TFT to achieve a certain layer pattern. For example, an unstructured layer may be patterned by photolithography and an etching process in order to achieve the desired layer size and structure, e.g., a pair of injection layers. Wherever reference is made herein to patterning by photolithography and etching it should be understood that instead thereof other suitable patterning techniques may be used, including but not limited to photo-patterning, printing, including inkjet printing, laser patterning and the like. In other words, it is contemplated and fully encompassed by the present invention that each and every step described herein as being carried out by photolithography and etching can be similarly be carried out by any other suitable patterning technique, including those listed above.

The term "substrate layer" or "substrate" as interchangeably used herein refers to a layer acting as a carrier for the semiconductor laminate.

The term "gate electrode layer" refers to an electrode which controls the flow of electric current from the source electrode across the semiconductor layer to the drain electrode.

The term "gate insulator layer" means a layer of dielectric material. Such a layer acts at the operating temperature of a semiconductor laminate as an insulator.

The term "injection layer" or "carrier injection layer" as interchangeably used herein means a layer of material or materials which can conduct electrical current from the S/D electrode layer(s) to the semiconductor layer or reverse.

The term "source and drain electrode layers" refers to one, optionally patterned, layer of stack of layers being in direct ohmic contact with the semiconductor layer of the TFT. The S/D electrode layer is a layer of material or materials which are at least electrically conductive.

The term "ohmic contact" is used to define an appropriate electrode-active oxide semiconductor layer contact. Specifically, an ohmic contact can be defined as a contact that has a negligible contact resistance relative to the bulk or spreading resistance of the semiconductor, Sze, Physics of Semiconductor Devices, Second Edition, 1981, page 304. As further stated therein, an appropriate ohmic contact will not significantly change the performance of the device to which it is attached, and it can supply any required current with a voltage drop that is appropriately small compared with the drop across the active region of the device.

The term "semiconductor layer" refers to an active oxide semiconductor layer. In the TFT the semiconductor laminate has a charge carrier mobility between 1 and 50 cm²/Vs (measured at 50 V gate-source-voltage, 50 V drain-source-voltage, 1 cm channel width and 20 μm channel length), wherein this can be determined by the model of "Gradual channel approximation". For this purpose, the equations for classical MOSFETs (metal-oxide-semiconductor field-effect transistor) may be applied. In the linear range the following applies:

$$I_D = W/L \; C_i \mu (U_{GS} - U_T - U_{DS}/2) U_{DS} \qquad (1)$$

wherein $I_D$ is the drain current, $U_{DS}$ is the drain-source-voltage, $U_{GS}$ is the gate-source voltage, $C_i$ is the area-normalized capacitance of the insulator, W is the width of the transistor channel, L is the channel length of the transistor, μ is the charge carrier mobility and $U_T$ is the threshold voltage.

In the saturation region, a quadratic dependence between the drain current and gate voltage applies, which is used herein to determine the charge carrier mobility:

$$I_D = W/(2L) C_i \mu (U_{GS} - U_T)^2 \qquad (2).$$

In certain embodiments, the semiconductor layer (106) comprises at least one metal oxide selected from the group consisting of an indium, gallium, zinc, and/or tin oxide.

In some embodiments, the semiconductor layer comprises at least one metal oxide selected from the group consisting of an indium, gallium, zinc, and/or tin oxide and at least one metal selected from the group consisting of antimony, hafnium, and aluminum.

In some embodiments, the semiconductor layer (106) essentially consists of a metal oxide semiconductor selected from the group consisting of IGZO, ITZO, ITO, GZO, ZTO, IZO, IGO, AZO, AZTO, HIZO, GTZO, GTO, tin oxide ($SnO_2$), gallium oxide ($Ga_2O_3$), indium oxide ($In_2O_3$), and zinc oxide (ZnO).

In some embodiments, the semiconductor layer (106) essentially consists of a metal oxide semiconductor selected from the group consisting of IGZO, ITZO, ITO, GZO, ZTO, IZO, indium oxide ($In_2O_3$), and zinc oxide (ZnO).

In various embodiments, the semiconductor layer essentially consists of ITO.

In various embodiments, the semiconductor layer essentially consists of IGO.

In various embodiments, the semiconductor layer essentially consists of indium oxide ($In_2O_3$).

To further improve TFT function, the semiconductor layer (106) may further comprise nitrogen, fluorine, chlorine, and/or silicon.

Usually the semiconductor layer (106) has a thickness of 1-100 nm, preferably of 5-30 nm.

In some embodiments, the semiconductor layer has a thickness of 1-100 nm, preferably of 2-80 nm, more preferably of 5-30 nm.

The substrate layer (100) preferably comprises glass, silicon, silicon dioxide, metal oxide, transition metal oxide, elementary metal or a polymeric material, e.g. polyimide (PI), polyethylene terephthalate (PET), polymethyl methacrylate (PMMA), or polycarbonate or a hybrid of inorganic and organic components, in particular silicone oxide and polyimide.

Usually, the substrate (100) has a thickness of 50 μm 0.7 mm. The substrate may in all embodiments disclosed herein be selected from materials including, but not limited to glass, plastic foil, metal foil, paper, etc.

Typically, the gate electrode layer (101) comprises a metal, preferably selected from Al, Ti, Mo, Cu, Ag, and/or Nd or a stack of alloy thereof, more preferably a stack of Mo/Al/Mo or Ti/Al/Ti Preferably, the gate electrode layer (101) has a thickness of 50 nm-500 nm, preferably of 80-400 nm, more preferably of 100-350 nm, most preferably of about 300 nm.

The gate insulator layer (102) according to the present invention preferably comprises or consists of a metal oxide or -nitride or transition metal oxide or -nitride, in particular silicon dioxide and/or -nitride, aluminum oxide, hafnium oxide, or titan oxide, a polymeric material, e.g. organic or inorganic polymer.

Furthermore, the gate insulator layer (102) preferably has a thickness of 10 nm-3 μm, preferably of 50-1000 nm, more preferably of 100-500 nm, most preferably of about 300 nm.

In some embodiments, the injection layer (103) comprises a metal oxide conductor selected from the group consisting of ITO, AZO, GZO, ATO, ZTO, IZO, IGO, AZTO, HIZO, GTZO, GTO, and FTO, preferably ITO, AZO, ATO, and FTO, more preferably ITO and AZO.

Preferably, the injection layer (103) essentially consists of ITO.

Preferably, the injection layer (103) has a thickness of 1 nm-200 nm, preferably of 10-150 nm, more preferably of 20-100 nm, most preferably of about 30-90 nm.

In some embodiments, the S/D electrode layer (104) comprises a metal, preferably selected from Al, Cu, Ag, and/or Nd or a stack or alloy thereof.

In various embodiments, the S/D electrode layer (104) essentially consists of a metal selected from the group consisting of Al, Cu, Ag and/or Nd or a stack or alloy thereof, preferably Al and/or Cu.

Typically, the S/D electrode layer (104) has a thickness of 10 nm-1 μm, preferably of 100-300 nm.

The term "metal" is understood herein as metals, semi-metals, and transition metals. Accordingly, the term "metal oxide" refers to oxides of metals, semi-metals, and transition metals.

The resulting TFT laminate has a significantly reduced contact resistance between the S/D electrode layer and the semiconductor layer leading to an increase of on-current and electron mobility.

In certain embodiments, the semiconductor layer (106) is arranged above the carrier injection layer (103) and the S/D electrode layer (104). That means that at least a part of the semiconductor layer (106) is arranged above the carrier injection layer (103) and the S/D electrode layer (104). Other parts of the semiconductor layer may be positioned such within the TFT laminate that the semiconductor layer has the same distance to the substrate layer as the carrier injection layer (103) and the S/D electrode layer (104), wherein the semiconductor layer, carrier injection layer and S/D electrode layer have the same orientation relative to the substrate layer.

In various embodiments, the TFT is in Bottom Gate and Bottom Contact configuration.

The term "bottom gate configuration" or "top gate configuration" is used in connection with the TFT, depending on whether the gate electrode layer is positioned in relation to the position of the substrate layer below or above the S/D electrode layer. In case, the gate electrode layer is positioned below the S/D electrode layer it is spoken of a bottom-gate configuration, whereas in case the gate electrode layer is positioned above the S/D electrode layer it is referred to a top-gate configuration.

The terms "bottom contact" and "top contact" also refer to the TFT laminate configuration. In "top contact" configuration, at least a part of the S/D electrode layer directly contacts the semiconductor layer from above, meaning at the substrate averted surface. Alternatively, the S/D electrode layer is horizontally positioned with the same distance to the substrate as the semiconductor layer and contacts the semiconductor layer via a side surface. In case of the "bottom contact" configuration, at least a part of the semiconductor layer contacts the substrate averted surface of the S/D electrode layer.

The term "side surface" refers in certain embodiments to a surface of a layer, wherein the surface is not parallel to substrate layer of the TFT. Typically, the side surface of a layer has a smaller surface area than the surface of the layer which is parallel to the substrate layer. Also, typically the longitudinal axis through the respective layer is more or less perpendicular to the side surface of the layer.

In some embodiments, the carrier injection layer (103) is deposited on the gate insulator layer (102). This means that there is direct contact between the gate insulator layer and the carrier injection layer. However, in certain embodiments further layers may be positioned between the injection layer and the gate insulator layer as long as the semiconductor layer directly contacts the gate insulator layer, the injection layer and S/D electrode layer.

An exemplary, non-limiting illustration of the TFT according to the present invention can be found in FIG. 3. Compared to the layer assembly of FIG. 2, the TFT of the present invention comprises an additional injection layer (103). In case a layer (107), which increases the contact resistance between the source-/drain-electrode layer (104) and the semiconductor layer (106), is formed, the injection layer (103) ensures indirect current flow from the source-/drain-electrode layer (104) to the semiconductor layer (106) and vice versa and thereby reduces the contact resistance.

Furthermore, the inventors found that it is even more beneficial if the above injection layer (104) is combined with a protection layer (105) arranged on the top of the source-/drain-electrode layer (104) to prevent the above mentioned the source-/drain-electrode layer (104) deterioration during the laminate annealing process. Thus, the combination of injection and protection layers further improves the conductivity of the laminate and the resulting TFT devices.

In various embodiments, the TFT further comprises a protection layer (105), wherein the protection layer is deposited on the S/D electrode layer.

The term "protection layer" refers to a layer of the semiconductor laminate preventing the deterioration of the S/D electrode layer. Specifically, the protection layer prevents oxidation of the S/D electrode layer during assembly of the TFT, in particular during etching of the S/D electrode layer and the provision of the semiconductor layer.

In certain embodiments, the protection layer (105) comprises a metal oxide conductor, and/or a metal, preferably selected from Mo, Ti, Ta, and Cr, more preferably Mo and Ti.

In various embodiments, the protection layer (105) has a thickness of 1 nm-5 μm, preferably of 5-100 nm, more preferably of 15-70 nm, most preferably of about 60 nm.

Preferably, the protection layer (105) essentially consists of a metal, preferably selected from the group consisting of Mo, Ti, Ta, and Cr, more preferably Mo and Ti, or a metal oxide conductor selected from the group consisting of ITO, AZO, GZO, ATO, ZTO, IZO, IGO, AZTO, HIZO, GTZO, GTO, and FTO, preferably ITO, AZO, ATO, and FTO, more preferably ITO and AZO.

In some embodiments, the TFT further comprises a protection layer (105), wherein the protection layer is deposited on the S/D electrode layer and the semiconductor layer (106) is deposited and patterned on the protection layer.

In various embodiments, the TFT further comprises a passivation layer (108), wherein the passivation layer is deposited on the semiconductor layer (106) and/or on the protection layer (105) if the TFT comprises a protection layer. Depending on the orientation of the TFT the passivation layer may be the topmost layer of the TFT and may be deposited (i) on the semiconductor layer (106) and the protection layer (105); or (ii) the protection layer (105); or (iii) the protection layer (105) and the etching stop layer (109). The passivation layer (108) may have a thickness of 300 to 3000 nm.

In various embodiments, the TFT further comprises a functionalization layer (107) deposited on the semiconductor layer (106) and optionally the protection layer (105) depending on the orientation and setup of the TFT. In such embodiments, the functionalization layer (107) may be located (i) between the passivation layer (108) on the one hand and the semiconductor layer (106) and optionally the protection layer (105) on the other hand. The functionalization layer may have a thickness of 5 to 100 nm, preferably 5-30 nm. Typically, the functionalization layer (107) has a thickness of 1-500 nm, preferably of 5-200 nm. Preferably, the functionalization layer (107) essentially consists of a metal oxide insulator selected from the group consisting of aluminium oxide, silicon oxide, silicon nitride, yttrium oxide, gallium oxide, hafnium oxide, titanium oxide, magnesium oxide, alkali metal oxide, alkaline earth metal oxide and mixtures thereof. Most preferably, the functionalization layer (107) essentially consists of aluminum oxide, yttrium oxide and titanium oxide.

The term "stack (of layers)", as used herein in connection with one of the layers, relates to a layer that itself consists again of more than one discrete layers. A stack of layers may thus include 2, 3, 4, 5, 6, 7, 8, 9, 10 or more layers stacked on top of each other and together forming one of the layers as defined herein. The different layers of the stack may have different compositions and thicknesses.

The term "passivation layer" means a layer covering the semiconductor layer, which serves for increasing the mechanical stability and protection of the semiconductor laminate.

In some embodiments, the passivation layer comprises $SiO_x$ or $SiN_x$, whereas in further embodiments the passivation layer essentially consists of $SiO_x$ or $SiN_x$ with x=0.1 to 3.

In certain embodiments, the semiconductor layer (106) directly contacts a) the gate insulator layer (102), b) a side surface of the carrier injection layer (103), and c) a side surface of the S/D electrode layer (104).

In some embodiments, the semiconductor layer (106) directly contacts a) the gate insulator layer (102), b) a side surface of the carrier injection layer (103), and c) a side surface of the S/D electrode layer (104) and the contact of the semiconductor layer (106) with the side surface of the S/D electrode layer (104) occurs above the contact of the semiconductor layer (106) with the side surface of the carrier injection layer (103).

In certain embodiments (cf. FIG. 4), the TFT laminate of the present invention comprises a substrate layer (100), a gate electrode layer (101), a gate insulator layer (102), an injection layer (103), a S/D electrode layer (104), and a semiconductor layer (106). The semiconductor layer (106) is in direct contact with a) the gate insulator layer (102), a) a side surface of the injection layer (103), and c) a side surface of the S/D electrode layer (104). In this embodiment, the contact between the side surface of the injection layer (103) and the semiconductor layer (106) is below of the contact between the side surface of the S/D electrode layer (104) and the semiconductor layer (106), wherein the substrate layer (100) defines the bottom of the TFT laminate.

As a non-limiting embodiment, cf. FIG. 4, a TFT laminate of the present invention may comprise a substrate layer (100), a gate electrode (101), a gate insulator layer (102), an injection layer (103), a S/D electrode layer (104), and a semiconductor layer (106). The a semiconductor layer (106) is in direct contact with a) the gate insulator layer (102), b) a side surface of the injection layer (103), and c) a side surface of the S/D electrode layer (104). In this embodiment, the contact between the side surface of the injection layer (103) and the semiconductor layer (106) occurs below the contact between the side surface of the S/D electrode layer (104) and the semiconductor layer (106), wherein the substrate layer (100) defines the bottom of the TFT laminate. Please note, that in this embodiment the semiconductor layer contacts the side surfaces of the S/D electrode layer and the injection layer but does not extend to above the S/D electrode layer (104). Thus, the semiconductor layer does not contact the substrate averted surface of the conductive layer.

Please note that FIG. 4 is cited herein for illustrative purpose only and should not be construed as limiting the embodiments. For example, the S/D electrode layer (104) disclosed in FIG. 4 may also extend up to a vertical position more far away from the substrate layer than the furthermost part of the semiconductor layer (106). In addition, in certain embodiments the S/D electrode layer (104) may additionally contact the semiconductor layer (106) from above, meaning that the conductive layer contacts the substrate averted surface of the active oxide semiconductor layer.

Furthermore, in alternative embodiments of the present invention, the TFT laminate resembles the previous embodiment with the proviso that the semiconductor layer reaches to above of the S/D electrode layer (104) (cf. FIG. 5). Such a laminate comprises a substrate layer (100), a gate electrode (101), a gate insulator layer (102), an injection layer (103), an S/D electrode layer (104), and a semiconductor layer (106). The semiconductor layer (106) is in direct contact with a) the gate insulator layer (102), b) a side surface of the injection layer (103), and c) a side surface of the S/D electrode layer (104). In this embodiment, the contact between the side surface of the injection layer (103) and the semiconductor layer (106) occurs below of the contact between the side surface of the S/D electrode layer (104) and the semiconductor layer (106), wherein the substrate layer defines the bottom of the laminate. Furthermore, as mentioned above, the semiconductor layer (106) may reach from the gate insulator layer (102) to above the S/D electrode layer (104).

In some embodiments, the semiconductor layer (106) is in contact with the substrate averted surface of the S/D electrode layer (104) or if the TFT comprises a protection layer (105) the semiconductor layer (106) is in contact with the substrate averted surface of the protection layer.

In various embodiments, the TFT comprises a protection layer (105), wherein the protection layer is arranged above the S/D electrode layer (104).

In some embodiments, the TFT further comprises a protection layer (105), wherein the protection layer is arranged above the S/D electrode layer (104) and wherein the semiconductor layer (106) reaches from the gate insulator layer (102) to above the protection layer.

For example, the herein described TFT laminate of the present invention may further comprise a protection layer (105) (cf. FIG. 6). Such TFT comprises a substrate layer (100), a gate electrode layer (101), a gate insulator layer (102), an injection layer (103), a S/D electrode layer (104), a protection layer (105), and a semiconductor layer (106). The semiconductor layer (106) is in direct contact with a) the gate insulator layer (102), b) a side surface of the injection layer (103), and c) a side surface of the S/D electrode layer (104). In this embodiment, the contact between the side surface of the injection layer (103) and the semiconductor layer (106) occurs below of the contact between the side surface of the S/D electrode layer (104) and the semiconductor layer (106), wherein the substrate layer defines the bottom of the laminate. Furthermore, the semiconductor layer (106) reaches from the gate insulator layer (102) to above the protection layer (105).

In certain embodiments, the semiconductor layer (106) is not located underneath the S/D electrode layer (104) or the injection layer (103). Accordingly, TFT configurations wherein the semiconductor layer (106) is above the injection layer (103) and the S/D electrode layer (104) and is located underneath of these two layers are excluded from the present invention.

In various embodiments, the TFT further comprises a pixel electrode.

In certain embodiments, at least a portion of the injection layer may be oriented in a plane substantially parallel with the plane of the semiconductor layer. The injection layer may be partially or entirely coextensive with the adjacent S/D electrode layer.

In all of the embodiments disclosed herein, the semiconductor laminate may comprise a pair of S/D electrode layers and a pair of injection layers instead of an S/D electrode layer and an injection layer. Embodiments furthermore comprising a protection layer are herewith disclosed as comprising a pair of protection layers if also a pair of injection layers and a pair of S/D electrode layers is present.

Accordingly, in some embodiments the TFT comprises a pair of injection layers (103) which are horizontally positioned within the TFT with equal distance relative to the substrate layer (100) and wherein the two injection layers are separated from each other by the semiconductor layer (106) and wherein the TFT comprises a pair of S/D electrode layers (104) which are horizontally positioned within the TFT with equal distance relative to the substrate layer (100) and wherein the two S/D electrode layers (104) are separated from each other by the semiconductor layer (106), and wherein the pair of S/D electrode layers (104) is positioned above and in direct contact with the pair of injection layers (103).

The term "a pair of layers" refers to two layers within the semiconductor laminate which may be obtained from a single layer being patterned, for example by photolithography and etching, resulting in the formation of a gap within the layer and the formation of two individual layers. Each layer or the pair of layers typically has the same distance to the substrate layer.

The term "horizontally positioned within the semiconductor laminate with equal distance relative to the at least one substrate layer" refers to the feature of a pair of layers, specifically to the fact that it has the same horizontal profile and distance to the substrate layer.

The term "separated from each other by the semiconductor layer" means that two layers are separated from each other by a gap and that the semiconductor layer is positioned within the gap between the two layers, wherein the presence of the semiconductor layer is not limited to the extension of the gap.

As an example, a TFT laminate of the present invention may comprise a substrate layer (100), a gate electrode layer (101), a gate insulator layer (102), a pair of injection layers (103), a pair of S/D electrode layers (104), a pair of protection layers (105), and a semiconductor layer (106) (cf. FIG. 7). The semiconductor layer (106) is in direct contact with a) the gate insulator layer (102), b) the side surfaces of the pair of injection layers (103), and c) the side surfaces of the pair of S/D electrode layers (104). In this embodiment, the contacts between the side surfaces of the pair of injection layers (103) and the semiconductor layer (106) occur below of the contacts between the side surfaces of the pair of S/D electrode layers (104) and the semiconductor layer (106), wherein the substrate layer defines the bottom of the laminate. Furthermore, the semiconductor layer (106) reaches from the gate insulator layer (102) to above the protection layer (105). In this configuration, the pair of S/D electrode layers is protected and an efficient flow of current between the S/D electrode layers and the semiconductor layer (106) is ensured.

In certain embodiments, the TFT laminate may further comprise a metal oxide layer deposited on the substrate averted surface of the semiconductor layer (106) as disclosed in WO 2013/050221 A1. This metal oxide layer may comprise the metal oxide selected from the group consisting of gallium oxide, zinc oxide, tin oxide, hafnium oxide, silicon oxide, aluminum oxide, titan oxide, alkali metal oxide, alkaline earth metal oxide and mixtures thereof. The entire disclosure of WO 2013/050221 A1 concerning the composition of the semiconductor layer and the metal oxide layer deposited thereon is hereby incorporated by reference.

Always if the terms "alkaline metal" or "alkaline earth metal" are used, all metals which fall into the respective group are disclosed. This means that if a particular embodiment comprises an alkali metal or alkaline earth metal, lithium, sodium, potassium, rubidium and/or cesium are disclosed as alkali metal and beryllium, magnesium, calcium, strontium and/or barium as alkaline earth metal.

Embodiments of TFT laminates of the present invention that include a passivation layer (108), as described above by reference to WO 2013/050221, a functionalization layer (107) and optionally an etching stop layer (ESL; 109) are schematically illustrated in FIGS. 9-12. These embodiments also form part of the invention without limiting the present invention thereto. It should be understood that all embodiments disclosed above that include layers 101-106 can further include one or more of the passivation layer (108), the functionalization layer (107) and the ESL (109), for example in configurations as shown in FIGS. 9-12. The passivation, functionalization and etching stop layers are defined as described above.

In a further aspect, the present invention also relates to a method of manufacture of a TFT.

Specifically, the present invention relates to a method of manufacture of a TFT comprising the steps of: providing a substrate (100); depositing and patterning a gate electrode (101) on the substrate (100); depositing a gate insulator layer (102) on the gate electrode (101) and the substrate (100); characterized in that the method further comprises providing a carrier injection layer (103) arranged above the gate insulator layer (102), providing a S/D electrode layer (104) deposited on the carrier injection layer (103), and providing a semiconductor layer (106), wherein the TFT is patterned such that the semiconductor layer directly contacts the gate insulator layer (102), the carrier injection layer (103), and the S/D electrode layer (104).

The term "providing a layer" means that a certain layer is implemented in the TFT laminate.

As mentioned above, semiconductor layers are understood here and hereinafter to mean layers which have charge mobilities of 1 to 50 $cm^2/Vs$ for a component with a channel length of 20 µm and a channel width of 1 cm at gate-source voltage 50 V and source-drain voltage 50 V.

As mentioned above, the term "patterning" means in the context of the present invention manipulating the structure of one or more layers or of the entire TFT to achieve a certain layer pattern. For example, an unstructured layer may be patterned by photolithography and an etching process in order to achieve the desired layer size and structure, e.g., a pair of injection layers or a gate electrode layer. Alternatively, different patterning techniques, such as those listed above, may be used.

In certain embodiments, the semiconductor layer (106) is arranged above the carrier injection layer (103) and the S/D electrode layer (104).

The term "depositing" in the context of the method of the present invention means that the layer is built up directly on another layer such that the two layers are in direct contact with each other.

Depositing in the context of the present invention thus comprises depositing compounds from the solid, gas, or liquid phase on a $1^{st}$ layer to form a $2^{nd}$ layer on the $1^{st}$ layer.

The skilled person is well familiar with suitable methods to dispose a layer on another one.

For example, the term "depositing" consists of printing, spraying method, spin coating method, dipping method and slot die coating, vacuum deposition, evaporation, and sputtering. In this context "printing" methods are selected from the group consisting of, but are not limited to flexographic/gravure printing, ink jet printing, offset printing, digital offset printing, and screen printing. Also encompassed by the present invention are processes that are based on a deposition of layers from the gas phase.

The term "liquid phase" in the context of the present invention is understood to mean those phases which are in liquid form under SATP conditions ("Standard Ambient Temperature and Pressure"; T=25° C. and p=1013 hPa).

In certain embodiments, deposition is selected from the group consisting of chemical vapor deposition CVD, sputtering, and liquid deposition.

The preparation of TFT laminates by means of printing processes enables much lower production costs compared to many other processes, for example Chemical Vapor Deposition (CVD), since the semiconductor can be deposited here in a continuous printing process. Furthermore, at low process temperatures, there is the possibility of working on flexible substrates, and possibly (in particular in the case of very thin layers and especially in the case of oxidic semiconductors) of achieving optical transparency of the printed layers.

The deposition may comprise the step of contacting a $1^{st}$ layer with a solid, gas, or liquid phase and further steps in order to form from the deposited compound/composition the desired layer.

The term "forming a layer" relates to a process wherein the respective layer is formed, e.g., from a liquid phase or a compound deposited by sputtering. Document WO 2013/050221 A1 discloses several methods and embodiments of forming a layer, i.e. a semiconductor layer. The entire teaching of this document is herewith incorporated by reference.

For example, the formation of a layer may comprise electromagnetic treatment, e.g., UV/IR/VIS treatment, and/or heat treatment.

In certain embodiments, the formation of a layer comprises heat treatment at 100-900° C., preferably at 100-800, 100-750, 100-500 or 150-350° C. For example, the semiconductor layer may be formed by heat treatment at 100-400° C., preferably at 150-350° C.

Especially, deposition of a $2^{nd}$ layer from a liquid phase on a $1^{st}$ layer may comprise depositing a liquid phase on the $1^{st}$ layer and forming the $2^{nd}$ layer on the $1^{st}$ layer from the liquid phase. The formation of the $2^{nd}$ layer may comprise UV/IR/VIS and/or heat treatment.

In certain embodiments, a liquid phase is applied in the absence of oxygen containing atmosphere, air, and/or reduced humidity. In other embodiments, the liquid phase can be applied under a protective gas.

In various embodiments, liquid phase comprises at least one organic solvent. Suitable solvents are selected from weakly protic and aprotic solvents, in particular solvents selected from the group of the nonpolar aprotic solvent. In various embodiments, the organic solvent is substantially anhydrous.

In this context, the term "photolithography" means a technique by which one or more layers of the TFT laminate are patterned by a lithographic method using a photoresist. For example, a photoresist is formed on a layer and patterned by exposing to light through a photo mask, followed by etching the layer or layers on which no photoresist layer is formed.

The term "etching" refers to the removal of layers from the surface of a TFT laminate during manufacturing. Etching is a critically important process module, and every TFT laminate undergoes many etching steps before it is complete. It is critically, that certain layers or parts of layers are protected from the etchant by a "masking" material which resists etching. In some cases, the masking material is a photoresist which has been patterned using photolithography.

Generally, the term "etching process" comprises dry etching and wet etching. Accordingly, if patterning comprises an etching process, patterning is achieved by either dry etching or wet etching.

The term "dry etching" refers to the removal of material, typically a masked pattern of semiconductor material, by exposing the material to a bombardment of ions, e.g., a plasma of reactive gases such as fluorocarbons, oxygen, chlorine, boron trichloride; sometimes with addition of nitrogen, argon, helium and other gases, that dislodge portions of the material from the exposed surface.

The term "wet etching" is an etching process that utilizes liquid chemicals or etchants to remove materials from the TFT laminate, usually in specific patterns defined by photoresist masks on the laminate. Materials not covered by these masks are 'etched away' by the chemicals while those covered by the masks are left almost intact. These masks were deposited on the laminate in an earlier wafer fabrication step referred to as "photolithography", as mentioned above.

The term "etching stop layer" (ESL) (109) relates to a layer which may be deposited above semiconductor layer to preserve the semiconductor layer from any damage during further process steps, e.g., etching. The ESL is typically of a thickness of 50 to 200 nm. Materials suitable for the ESL include, but are not limited to $SiO_x$, $SiN_x$, $AlO_x$ and organic compounds as well as mixtures and stacks thereof.

The skilled person is aware of prior art methods with which it is possible to form from a liquid phase containing at least one metal oxide precursor, a metal oxide layer having a desired film thickness. Sufficient are for example simple dilution series. The obtained layer thicknesses may be determined by ellipsometry (M. Schubert: Infrared Ellipsometry on semiconductor layer structures: phonons, plasmon and polariton In: Springer Tracts in Modern Physics 209, Springer-Verlag, Berlin, 2004), TEM, SEM or atomic force microscopy (G. Binnig, C F Quate, C. Gerber: Atomic force microscope. journal Physical Review Letters. 56, 1986, pp. 930-933). On this basis, the skilled person is able to determine further parameters, such as the sample volume, the compound concentration, and, where appropriate, the particle density in the liquid phase, which allow to obtain the desired layer thickness. For example, the semiconductor layer (106) may comprise metal oxide or metal oxide precursors and the skilled person is well in the position to determine the necessary volume to be applied and the metal oxide or metal oxide precursor concentration in the sample, and, where appropriate, the particle density in the liquid phase, which allow to obtain the desired metal oxide layer thickness.

In certain embodiments, the semiconductor layer (106) is arranged above the carrier injection layer (103) and the S/D electrode layer (104).

Furthermore, the gate electrode is typically provided on the substrate by depositing the gate electrode layer on the substrate. Afterwards, the gate electrode layer is patterned, e.g., by photolithography and etching.

Hence, in some embodiments, depositing and patterning of the gate electrode comprises photolithography and an etching process. Alternatively, other patterning techniques, including but not limited to photo-patterning, printing, including inkjet printing, laser patterning and the like, may be used.

In certain embodiments, afterwards the gate insulator layer (102) is deposited on the gate electrode layer and the substrate.

The deposition of the gate insulator layer on the gate electrode and the substrate may comprise chemical vapor deposition (CVD) of the gate insulator layer.

Typically, in the following step the injection layer (103) is provided on the gate insulator layer. The provision of the carrier injection layer (103) may comprise sputtering of the carrier injection layer above the gate insulator layer (102). This may be followed by deposition of the S/D electrode layer (104) on the injection layer (103). The deposition of the S/D electrode layer (104) on the carrier injection layer (103) may comprise sputtering of the S/D electrode layer (103). Patterning of the TFT may comprise photolithography and etching of the injection layer (103) and S/D electrode layer (104) in one step.

In certain embodiments, a protection layer (105) is deposited on the S/D electrode layer (104). In case the TFT comprises a protection layer, patterning of the TFT may comprise photolithography and etching of the injection layer (103), S/D electrode layer (104), and protection layer (105) in one step.

In certain embodiments, providing of the injection layer (103) and the S/D electrode layer (104) comprises patterning of the injection layer (103) and S/D electrode layer (104), for example by photolithography and etching, resulting in the formation of a pair of injection layers and a pair of S/D electrode layers.

In some embodiments, the deposition of the injection layer (103) may comprise depositing the injection layer via a solution or vacuum process, e.g., by spin coating, slot die coating, evaporation, or sputtering.

In further embodiments, the deposition of the S/D electrode layer (104) on the injection layer (103) may comprise depositing the S/D electrode layer via a solution or vacuum process, e.g., by spin coating, slot die coating, evaporation, or sputtering.

In addition, the provision of the semiconductor layer (106) may comprise depositing the semiconductor layer via sputtering, spin coating, or slot die coating. Also, the provision of the semiconductor layer (106) comprises patterning of the semiconductor layer, for example via photolithography and etching.

In some embodiments, the method comprises the provision of the protection layer (105) and providing of the injection layer (103), the S/D electrode layer (104), and the protection layer (105) comprises patterning of the injection layer (103), S/D electrode layer (104), and protection layer (105), for example by photolithography and etching, resulting in the formation of a pair of injection layers, a pair of S/D electrode layers, and a pair of protection layers (105).

Furthermore, in some embodiments, the provision of the carrier injection layer (103) comprises depositing the carrier injection layer (103) on the gate insulator layer (102). On the other hand, in certain embodiments, the injection layer (103) may be deposited on a layer covering the gate insulator layer (102).

The inventors of the present invention found that the combination of an injection layer beneath the S/D electrode layer and a protection layer deposited on the substrate averted surface of the S/D electrode layer improves the conductive properties of the TFT.

Hence, the method may further comprise providing a protection layer (105), wherein the protection layer is deposited on the S/D electrode layer.

In some embodiments, the method comprises providing a protection layer (105), wherein the protection layer is deposited on the S/D electrode layer and the semiconductor layer (106) is deposited and patterned on the protection layer. This means that a part of the semiconductor layer is deposited on the substrate averted surface of the protection layer (105).

In some embodiments, in one patterning process involving, e.g. photolithography and etching, a pair of injection layers (103) and a pair of S/D electrodes (104) is formed, wherein each member of the pair of layers is in contact with one member of the other pair of layers. In case the process involves the deposition of a protection layer (105) on the S/D electrode layer, in the same patterning process involving, e.g. photolithography and etching, a pair of protection layers (105) is formed. Also, each member of the pair of protection layers contacts one member of the pair of S/D electrode layers (104) and each member of the S/D electrode layers (104) contacts one of the pair of injection layers (103). The patterning process forms a gap between the pair of layers.

Thus, in some embodiments the method comprises providing the semiconductor layer (106) such that it directly contacts a) the gate insulator layer (102), b) a side surface of the carrier injection layer (103), and c) a side surface of the S/D electrode layer (104).

In certain embodiments, the semiconductor layer (106) is provided such that the contact of the semiconductor layer (106) with the side surface of the S/D electrode layer (104) occurs above the contact of the semiconductor layer (106) with the side surface of the carrier injection layer (103).

In various embodiments, the semiconductor layer is positioned between the pair of injection layers (103) and the pair of S/D electrode layers (104) and does not extend above the pair of S/D electrode layers. Such a configuration may be represented by FIG. 4, wherein the semiconductor layer does not contact the substrate averted surface of the S/D electrode layers.

The semiconductor layer (106) is deposited on this assembly of layers. The semiconductor layer (106) is deposited on this assembly such that it directly contacts the gate insulator layer (102), the pair of injection layers (103), and the pair of S/D electrode layers (104).

In various embodiments, providing the semiconductor layer (106) comprises depositing the semiconductor layer (106) such that the pair of injection layers is separated from each other by the semiconductor layer (106) and the pair of S/D electrode layers (104) is separated from each other by the semiconductor layer (106), and wherein the pair of S/D electrode layers (104) is positioned above and in direct contact with the pair of injection layers (103).

In certain embodiments, providing the semiconductor layer (106) comprises depositing the semiconductor layer (106) such that the pair of injection layers is separated from each other by the semiconductor layer (106), that the pair of S/D electrode layers (104) is separated from each other by the semiconductor layer (106), and that the pair of protection layers (105) is separated from each other by the semiconductor layer (106), and wherein the pair of protection layers (105) is positioned above and in direct contact with the pair of S/D electrode layers (104), and the pair of S/D electrode layers (104) is positioned above and in direct contact with the pair of injection layers (103).

Thus, in some embodiments the semiconductor layer directly contacts the gate insulator layer (102) and contacts a side surface of each of the layers of the pair of injection layers (103) and side surface of each of the layers of the pair of S/D electrode layers (104). Thus, the contact between the semiconductor layer and the pair of S/D electrode layers may occur above the contact of the semiconductor layer with the pair of injection layers (103). Specifically, the contact of the semiconductor layer (106) with the side surfaces of the S/D electrode layers may occur above the contact of the semiconductor layer with the side surfaces of the injection layers (103). Of course, the contacts of the semiconductor layer (106) with the side surfaces of the pair of S/D electrode layers (104) and the side surfaces of the pair of injection layers (103) may occur above the contact with the gate insulator layer (102).

In some embodiments, the etching process to obtain the gate electrode layer (101), the pair of electrodes (104), the pair of injection layers (104), and the pair of protection layers (105) is either dry or wet etching; the etching process to obtain the semiconductor layer (106) and the pixel electrode layer is wet etching; and/or the etching process to form the through hole is dry etching.

In various embodiments, the semiconductor layer (106) is provided such that the semiconductor layer (106) is not located underneath the S/D electrode layer (104) or the injection layer (103). That means that while the semiconductor layer contacts the injection layer (103), the S/D electrode layer (104), and the gate insulator layer (102) it neither contacts the injection layer (103) nor the S/D electrode layer (104) at a substrate facing surface.

In certain embodiments, the TFT comprises a protection layer (105), wherein the protection layer is arranged above S/D electrode layer (104).

In case, the TFT laminate comprises the protection layer (105) and after patterning the pair of protection layers (105), the semiconductor layer (106) may also contact the side surfaces of the pair of protection layers (105). The contact with the side surfaces of the pair of protection layers may occur above the contact of the semiconductor layer with the side surfaces of the pair of S/D electrode layers and the side surfaces of the pair of injection layers (103) and the contact with the gate insulator layer (102).

However, in further embodiments the semiconductor layer arranged above the S/D electrode layer (104) and the injection layer (103) meaning that it is deposited on the pair of S/D electrode layers. In case the method comprises deposition of a protection layer on the S/D electrode layer (104), arranging of the semiconductor layer above the S/D electrode layer means deposition of the semiconductor layer on the protection layer (105) which is deposited on the S/D electrode layer. Thus, the semiconductor layer is arranged above the S/D electrode layer (104) without direct contact via the substrate averted surface of the S/D electrode layer (104) in case a protection layer is positioned in between these two layers. Otherwise, the semiconductor layer (106) and the S/D electrode layer directly contact with each other via the substrate averted surface of the S/D electrode layer. The arrangement of the semiconductor layer may occur on the TFT laminate after patterning of the S/D electrode layer and injection layer (103) and protection layer, if the method includes the provision of a protection layer. If the semiconductor layer (106) is arranged above the S/D layer that means under these circumstances that the layer is positioned, e.g., as shown in FIGS. 5 and 6, wherein the semiconductor layer reaches from the gate insulator layer (102) to above the S/D electrode layer wherein the semiconductor layer either contacts the S/D electrode layer at the substrate averted surface (cf. FIG. 5) or if a protection layer is present, the semiconductor layer contacts the substrate averted surface of the protection layer (cf. FIG. 6). In some embodiments thus the semiconductor layer directly contacts the gate insulator layer (102), contacts a side surface of each of the layers of the pair of injection layers (103) and side surface of each of the layers of the pair of S/D electrode layers (104), and the substrate averted surface of the S/D electrode layer.

Accordingly, the semiconductor layer (106) may be provided such that the semiconductor layer (106) is in contact with the substrate averted surface of the S/D electrode layer (104) or if the TFT comprises a protection layer (105) the semiconductor layer (106) is in contact with the substrate averted surface of the protection layer.

Then, the contact between the semiconductor layer and the pair of S/D electrode layers may occur above the contact of the semiconductor layer with the pair of injection layers (103). Specifically, the contact of the semiconductor layer (106) with the side surfaces of the S/D electrode layers may occur above the contact of the semiconductor layer with the side surfaces of the injection layers (103). Of course, the contacts of the semiconductor layer (106) with the side surfaces of the pair of S/D electrode layers (104) and the side surfaces of the pair of injection layers (103) may occur above the contact with the gate insulator layer (102).

In case, the TFT laminate comprises the protection layer (105) and after patterning comprises the pair of protection layers (105), the semiconductor layer (106) may also contact the side surfaces of the pair of protection layers (105). Thus, the semiconductor layer (106) may contact the substrate averted surface of the pair of protection layers (105), the side surfaces of the pair of protection layers (105), the side surfaces of the pair of S/D electrode layers (104), the side surfaces of the injection layers (103), and the gate insulator layer (102). The contact with the side surfaces of the pair of protection layers may occur above the contact of the semiconductor layer with the side surfaces of the pair of S/D electrode layers and the side surfaces of the pair of injection layers (103) and the contact with the gate insulator layer (102). Such TFT may be illustrated by FIG. 7.

In some embodiments, the TFT further comprises a protection layer (105), wherein the protection layer is arranged above S/D electrode layer (104) and wherein the semiconductor layer (106) is provided such that the semiconductor layer (106) reaches from the gate insulator layer (102) to above the protection layer (cf. FIG. 6).

In order to provide a stable TFT, the TFT laminate may include a passivation layer (108). Accordingly, in some embodiments the method according the present invention comprises the provision of a passivation layer (108). In such embodiments, the TFT laminate may further include a functionalization layer located between the semiconductor layer and the passivation layer.

Specifically, the method may further comprise providing a passivation layer (108), wherein the passivation layer is deposited on the semiconductor layer (106). The deposition of the passivation layer may comprise coating via CVD. If a functionalization layer (107) is present, this layer may be deposited on the semiconductor layer, for example by coating via CVD, before in a subsequent step the passivation layer is deposited on said functionalization layer, as described above.

Furthermore, the method may comprise providing a through hole. The through hole may be formed by photolithography and etching or other suitable patterning techniques.

Also, the method may comprise providing a pixel electrode. The provision of the pixel electrode may comprise deposition of the pixel electrode by sputtering. Furthermore, provision of the pixel electrode comprises patterning of the deposited pixel electrode, for example by photolithography and etching.

In certain embodiments, the S/D electrode layer or pair of S/D electrode layers (104) is provided comprising a metal, preferably selected from Al, Cu, Ag, and/or Nd or a stack or alloy thereof.

In various embodiments, the S/D electrode layer or pair of S/D electrode layers (104) is provided essentially consisting of a metal selected from the group consisting of Al, Cu, Ag, and/or Nd or a stack or alloy thereof, preferably Al and Cu. In some embodiments, the S/D electrode layer or pair of S/D electrode layers (104) is provided essentially consisting of a metal selected from the group consisting of Al, Mo, Cu, or Nd or a stack or alloy thereof. More preferably, the S/D electrode layer (104) is provided as a layer essentially consisting of Al and/or Cu.

In certain embodiments, the method comprises providing the electrode layer or pair of electrode layers (104) having a thickness of 10 nm-500 nm, preferably 100-300 nm.

In some embodiments, the gate electrode layer (101) is provided comprising a metal, preferably selected from Al, Ti, Mo, Cu, and/or Nd or a stack or alloy thereof.

In various embodiments, the gate electrode (101) is provided essentially consisting of a metal selected from the group consisting of Al, Mo, Cu, Ti, or Nd, preferably a stack of Mo/Al/Mo or Ti/Al/Ti. In some embodiments, the gate electrode layer (102) is provided essentially consisting of a metal selected from the group consisting of Al, Mo, Cu, or Nd or a stack or alloy thereof.

In further embodiments, the gate electrode layer (101) is provided having a thickness of 50 nm-500 nm, preferably of about 300 nm.

In certain embodiments, the injection layer or pair of injection layers (103) is provided comprising a metal oxide conductor.

In various embodiments, the injection layer or pair of injection layers (103) is provided essentially consisting of a metal oxide conductor essentially consisting of ITO, AZO, GZO, ATO, ZTO, IZO, IGO, AZTO, HIZO, GTZO, GTO, or FTO. Preferably, the injection layer (103) is provided essentially consisting of ITO and/or AZO.

In some embodiments, the injection layer or pair of injection layers (103) is provided having a thickness of 1 nm-200 nm, preferably of 20-100 nm.

In various embodiments, the gate insulator layer (102) is provided comprising or consisting of a metal or transition metal oxide, in particular silicon dioxide and/or -nitride, aluminum oxide, hafnium oxide titan oxide, or titan oxide, a polymeric material, e.g. organic or inorganic polymer.

In certain embodiments, the gate insulator layer (102) is provided having a thickness of 10 nm-3 µm, preferably of 50-1000 nm, more preferably of 100-500 nm, most preferably of about 300 nm.

In some embodiments, the substrate layer (100) is provided comprising glass, silicon, silicon dioxide, metal oxide, transition metal oxide, elementary metal or a polymeric material, e.g. polyimide (PI), polyethylene terephthalate (PET), polymethyl methacrylate (PMMA) or polycarbonate and a hybrid of inorganic and organic components, in particular silicone oxide and polyimide.

In certain embodiments, the substrate layer (100) is provided having a thickness of 50 µm-0.7 mm.

In various embodiments, the semiconductor layer (106) is provided comprising at least one metal oxide selected from the group consisting of an indium, gallium, zinc, and/or tin oxide.

Optionally, the semiconductor layer has also shares from an incomplete conversion or incomplete removal of emerging byproducts. Thus, the metal oxide semiconductor layer may still have, for example carbene, halogen, alkoxide and/or oxoalkoxide compounds. Also, the semiconductor layer may have further metals may be in elemental or oxide form.

The formation of a metal oxide layer may comprise the transformation of the metal into a metal oxide by oxidation or the transformation of a metal oxide precursor into the corresponding metal oxide.

For example, if a $2^{nd}$ layer is to be deposited on $1^{st}$ layer, the deposition may comprise disposing a metal oxide precursor on the $1^{st}$ layer. Afterwards, the metal oxide of the $2^{nd}$ layer may be formed from the metal oxide precursor.

The term "metal oxide precursor" in the sense of the present invention, refers to a substance or compound which can be thermally or with electromagnetic radiation, in the presence or absence of oxygen or other oxidizing agents, converted into a metal oxide. Examples of metal oxide precursors are elemental metal, metal salts, organometallic compounds such as metal alkoxides and metal oxoalkoxides, which can be converted into the corresponding metal oxide by the skilled artisan.

For example, if a $2^{nd}$ layer is to be deposited on $1^{st}$ layer, the deposition may comprise disposing a liquid phase on the $1^{st}$ layer, wherein the liquid phase comprises a metal oxide precursor. After deposition of the liquid phase on the $1^{st}$ layer, the metal oxide of the $2^{nd}$ layer may be formed by transforming the metal oxide precursor into the corresponding metal oxide. In this case, the formation of the $2^{nd}$ layer may comprise evaporation of the liquid phase. For example the liquid phase may be evaporated using vacuum and/or heat treatment. Suitable metal oxide precursors are well described in the art, and thus known in the art is sufficient. Further details are disclosed in WO 2013050221 A1. The disclosure of this document regarding metal oxide precursors and methods of their transformation into the corresponding metal oxides is hereby incorporated by reference. Furthermore, WO2010/094583 A1 and WO2011/020792 A1 reveal suitable metal precursors. The disclosure of this document is hereby incorporated in their entirety.

In certain embodiments, the metal oxide precursor is a organometallic compound necessary for forming the metal oxide layer comprises at least one substituent selected from the group consisting of hydrogen, substituted or non-substituted $C_{1-50}$ alkyl, substituted or non-substituted $C_{1-50}$ alkenyl, substituted or non-substituted $C_{1-50}$ alkynyl, substituted or non-substituted $C_{1-50}$ alkoxy, substituted or non-substituted $C_{1-50}$ aryl, substituted or non-substituted $C_{1-50}$ hetero aryl, substituted or non-substituted $C_{1-50}$ oxoalkoxy, substituted or non-substituted $C_{1-50}$ alkylaryl, substituted or non-substituted $C_{1-50}$ aralkyl, substituted or non-substituted $C_{1-50}$ alkylheteroaryl, substituted or non-substituted $C_{1-50}$ cycloalkyl, and substituted or non-substituted $C_{1-50}$ hetero cycloalkyl.

The substituents of the organometallic compound are selected from the group consisting of $C_{1-50}$ alkyl, $C_1$-50 alkenyl, $C_{1-50}$ alkynyl, $C_{1-50}$ alkoxy, $C_{1-50}$ aryl, $C_{1-50}$ hetero aryl, $C_{1-50}$ oxoalkoxy, $C_{1-50}$ alkylaryl, $C_{1-50}$ aralkyl, $C_{1-50}$ alkyl hetero aryl, $C_{1-50}$ cycloalkyl, and $C_{1-50}$ hetero cycloalkyl.

In some embodiments, the organometallic compounds comprise at least one halogen selected from the group consisting of F, Cl, Br, and I.

The term "metal alkoxide" refers to a compound consisting of at least one metal atom, at least one residue according to formula-OR (R=organic residue), and optionally one or more further organic residues —R, one or more halogen residues and/or one or more —OH or —OROH residues.

In contrast to metal alkoxides, metal oxoalkoxides has at least one further oxygen residue (oxo residue) which is either directly or via a bridge bound to at least one metal atom.

Accordingly, in various embodiments the metal alkoxide or metal oxoalkoxide may be a alkoxide/oxoalkoxide with at least one $C_{1-15}$ alkoxy or oxyalkylalkoxy group, in particular one $C_{1-10}$ alkoxy or oxyalkylalkoxy group. More preferably, the metal alkoxide and oxyalkylakyloxy is a metal alkoxide and oxoalkoxide of generic formula $M(OR)_x$, wherein R is $C_{1-15}$ alkyl or alkyloxyalkyl group, more preferably $C_{1-10}$ alkyl or alkyloxyalkyl group. Wherein x is an even number, which is equal to the oxidation number of the metal (M). In certain embodiments, the oxidation number of the metal in the matter precursor corresponds to the oxidation number of the metal in the metal oxide forming the metal oxide layer. Even more preferred are metal alkoxides of formula M(OCH$_3$)$_x$, M(OCH$_2$CH$_3$)$_x$, M(OCH$_2$CH$_2$OCH$_3$)$_x$, M(OCH (CH$_3$)$_2$)$_x$ or M(O(CH$_3$)$_3$)$_x$. Also preferred is M(OCH (CH$_3$)$_2$)$_x$ (metal isopropoxide). In case such metal oxide precursor is chosen for the formation of the semiconductor layer, M may be chosen from the group consisting of indium, gallium, zinc, and tin.

In some embodiments, the semiconductor layer is provided comprising at least one metal oxide selected from the group consisting of an indium, gallium, zinc, and/or tin oxide and at least one metal selected from the group consisting of antimony, hafnium, and aluminum.

In various embodiments, the semiconductor layer comprises at least indium oxide and is formed from at least one indium precursor, in particular from at least one indium alkoxide precursor or indium oxoalkoxide precursor. The indium alkoxide or indium oxoalkoxide is is preferably a indium(III)-alkoxide/oxoalkoxide. More preferably, it is a indium(III) alkoxide/oxoalkoxide with at least one C$_{1-15}$ alkoxy or oxyalkylalkoxy group, in particular at least one C$_{1-10}$ alkoxy or oxyalkylalkoxy group. Even more preferred is a indium(III) alkoxide/oxoalkoxide having an alkoxide of the generic formula In(OR)$_3$, wherein R is a C$_{1-15}$ alkyl or alkyloxyalkyl group, more preferably a C$_{1-10}$ alkyl or alkyloxyalkyl group. In particular preferred are indium(III) alkoxide or oxoalkoxide according to the generic formula In(OCH$_3$)$_3$, In(OCH$_2$CH$_3$)$_3$, In(OCH$_2$CH$_2$OCH$_3$)$_3$, In(OCH (CH$_3$)$_2$)$_3$ or In(O(CH$_3$)$_3$)$_3$. Most preferred is In(OCH (CH$_3$)$_2$)$_3$ (indium isopropoxide).

In certain embodiments, a metal oxoalkoxide may be used as metalloxide precursor having the generic formula M$_x$O$_y$ (OR)$_z$[O(R'O)$_c$H]$_a$X$_b$[R''OH]$_d$ with M=In, Ga, Sn and/or Zn. In case a metal oxide layer is deposited on the semiconductor layer and metal oxoalkoxide precursor according to the above formula may be used, M=Ga, Sn, Zn, Al, Ti, Li, Na, K, Rb, Cs, Be, Mg, Ca, Sr, Ba, Hf and/or Si. In any case x=3-25, y=1-10, z=3-50, a=0-25, b=0-20, c=0-1, d=0-25, R, R', R''=organic residue, and X=F, Cl, Br, or I.

Specially, the semiconductor layer (106) may be formed from a metal oxide precursor, as defined above (cf. WO 2013050221 A1).

In certain embodiments, the semiconductor layer (106) is provided essentially consisting of a metal oxide semiconductor selected from the group consisting of IGZO, ITZO, ITO, GZO, ZTO, IZO, IGO, AZO, AZTO, HIZO, GTZO, GTO, tin oxide (SnO$_2$), gallium oxide (Ga$_2$O$_3$), indium oxide (In$_2$O$_3$), and zinc oxide (ZnO).

In some embodiments, the semiconductor layer (106) is provided essentially consisting of a metal oxide semiconductor selected from the group consisting of IGZO, ITZO, ITO, GZO, ZTO, IZO, indium oxide (In$_2$O$_3$), and zinc oxide (ZnO).

In various embodiments, the semiconductor layer is provided essentially consisting of ITO.

In various embodiments, the semiconductor layer is provided essentially consisting of IGO.

In various embodiments, the semiconductor layer is provided essentially consisting of indium oxide (In$_2$O$_3$).

In various embodiments, the method comprises providing the semiconductor layer (106) with nitrogen, fluorine, chlorine, and/or silicon.

In some embodiments, the semiconductor layer (106) is provided having a thickness of 1-200 nm, preferably of 1-100 nm, more preferably of 1-50 nm, most preferably of about 10 nm.

In further embodiments, the method comprises providing a protection layer or pair of protection layers (105) comprising a metal oxide conductor, and/or metal, the metal preferably being selected from Mo, Ti, Ta, and Cr, preferably Mo and Ti.

In various embodiments, the protection layer or pair of protection layers (105) is provided essentially consisting of a metal oxide conductor selected from the group consisting of ITO, AZO, GZO, ATO, ZTO, IZO, IGO, AZTO, HIZO, GTZO, GTO, and FTO, preferably ITO, AZO, ATO, and FTO. Preferably, the protection layer or pair of protection layers (105) is provided essentially consisting of ITO and/or AZO.

In some embodiments, the protection layer or pair of protection layers (105) is provided having a thickness of 10 nm-500 nm, preferably of 50-100 nm.

In certain embodiments, the method of the present invention comprises the deposition of a metal oxide layer deposited on the substrate averted surface of the semiconductor layer (106). This metal oxide layer may be the $2^{nd}$ metal oxide layer in the sense of the disclosure WO 2013/050221 A1 and further improve the conductive properties of the TFT. The disclosure of this document is herewith incorporated by reference. This $2^{nd}$ metal oxide layer may contain at least one metal oxide selected from the group consisting of gallium oxide, zinc oxide, tin oxide, hafnium oxide, silicon oxide, aluminum oxide, titanium oxide, alkali metal oxides, alkaline earth metal oxides or mixtures thereof and may be formed from a second liquid phase, wherein the second liquid phase comprises at least one metal oxide or at least one metal oxide precursor wherein the metal is selected from the group consisting of gallium oxide, zinc oxide, tin oxide, hafnium oxide, silicon oxide, aluminum oxide, alkali metal oxides, alkaline earth metal oxides or mixtures thereof, wherein the semiconductor layer (106) comprises at least one metal oxide which is different from the at least one metal oxide of the second layer.

Typically, in a method according to the present invention only 5 photolithographic and etching steps are required to produce a TFT comprising a substrate layer, a gate electrode layer (101), a gate insulator layer (102), an injection layer (103), an S/D electrode layer (104), a semiconductor layer (106), a passivation layer (108) and optionally a functionalization layer (107), a through hole, and the pixel electrode layer. The photolithographic step involves the use of a photo mask. The injection layer and S/D electrode layer are patterned within the same step, meaning that one mosque is sufficient to perform the patterning technique, e.g. photolithography and etching, of the two layers. The inclusion of protective layer (105) does not increase the number of photolithographic and etching steps because the injection layer (103), the S/D electrode layer (104), and the protection layer (105) are patterned within one patterning step, e.g. one photolithographic and etching step, using the same mask.

Often, methods of TFT production require the use of 6 masks, especially if the TFT is provided in the Bottom Gate Top Contact configuration. Each use of an additional mask/additional photolithographic and etching step significantly increases the costs of TFT production. Accordingly, the method of the present invention not only allows the production of improved TFTs which are more resistant to the production conditions, e.g., high temperature treatments during the production, and show improved conductive properties, but also significantly simplifies the production process and reduces the expenses for TFT production. The TFTs according to the present invention have a high conductivity bus line for signal transportation. Furthermore, the process conditions interfere less with the conductive properties of the TFT, specifically, the process steps and conditions have less impact on the semiconductor layer.

Nevertheless, even though the TFTs of the present invention and methods of their production concern TFTs which are devoid of S/D electrode layer deteriorations, e.g., due to formation of oxide layer 107, deposition of the semiconductor layer on the S/D electrode layer and a semiconductor layer deposited on the S/D electrode layer comprises deposition of the semiconductor on a layer formed from the S/D electrode layer. Thus in certain circumstances, the deposition of the semiconductor occurs on a layer 107 which is formed due to S/D electrode oxidation and the TFT comprises a semiconductor deposited on a layer 107 which is formed due to S/D electrode oxidation.

Typically, the method of TFT production according to the present invention comprises providing a substrate (100), depositing and patterning a gate electrode (101) on the substrate (100), wherein depositing and patterning the gate electrode comprises a photolithographic and etching step, depositing a gate insulator layer (102) on the gate electrode (101) and the substrate (100), providing a carrier injection layer (103) arranged above the gate insulator layer (102), wherein the injection layer preferably is deposited on the gate insulator layer, providing an S/D electrode layer (104) deposited on the carrier injection layer (103), patterning the injection layer and S/D electrode layer in one step, wherein patterning the injection layer and S/D electrode layer comprises a photolithographic and etching step, providing a semiconductor layer (106), preferably depositing the semiconductor layer on the S/D electrode layer, patterning of the semiconductor layer, wherein patterning the semiconductor layer comprises a photolithographic and etching step, depositing a passivation layer (108) and optionally a functionalization layer (107) on the semiconductor layer (106), forming a through hole in the TFT, depositing pixel electrode layer on the TFT, followed by patterning the pixel electrode layer, wherein patterning the pixel electrode layer comprises a photolithographic and etching step, wherein the TFT is patterned such that the semiconductor layer directly contacts the gate insulator layer (102), the carrier injection layer (103), and the S/D electrode layer (104). Typically, the semiconductor layer directly contacts the gate insulator layer (102), a side surface of the injection layer (103), and a side surface of the S/D electrode layer (104).

Generally, depositing the semiconductor layer on the S/D electrode layer comprises depositing the semiconductor layer on the S/D electrode layer and, if the injection layer and S/D electrode layer are patterned to result in the pair of injection layers and a pair of S/D electrode layers, additionally comprises depositing the semiconductor layer within the gap between the pair of injection layers and the pair of S/D electrode layers.

In case the method comprises the deposition of a protection layer (105) on the S/D electrode layer, the above method maintains the same number of photolithographic and etching steps, as the injection layer, S/D electrode layer, and protection layer are patterned in the same step. The only modification to the above method is that the semiconductor layer (106) is deposited on the protection layer (105).

Of course, depositing the semiconductor layer on the S/D electrode layer comprises depositing the semiconductor layer on the S/D electrode layer and, if the injection layer, S/D electrode layer, and protection layer are patterned to result in a pair of injection layers, a pair of S/D electrode layers, and a pair of protection layers, additionally depositing the semiconductor layer within the gap between the pair of injection layers and the pair of S/D electrode layers.

Thus, in various embodiments, the TFT is in Bottom Gate and Bottom Contact configuration.

The TFTs according to the present invention comprising the injection layer have an additional carrier transport path which improves the conductive properties of the TFTs. Specifically high on-current thin film transistors are obtained. Furthermore high temperature exposure of the S/D electrode layer during TFT fabrication and concomitant S/D electrode layer oxidation does not raise the effective resistivity under these circumstances. Furthermore, the additional implementation of the protection layer will further protect the S/D electrode layer during high temperature processes and thereby prevent film deformation (hillock) which also negatively influences the conductive properties of the TFT.

However, in certain embodiments TFT and the method of the present invention may also relate to TFTs in Bottom Gate and Top Contact configuration.

In such embodiments, the method comprises providing a substrate (100), depositing and patterning a gate electrode (101) on the substrate (100), wherein depositing and patterning the gate electrode comprises a photolithographic and etching step, depositing a gate insulator layer (102) on the gate electrode (101) and the substrate (100), providing a semiconductor layer (106), wherein the semiconductor layer is deposited and patterned on the gate insulator layer (102), wherein depositing and patterning the semiconductor layer comprises a photolithographic and etching step, providing an etching stopper layer (ELS) on the semiconductor layer, optionally after having deposited a functionalization layer (107) on the semiconductor layer, comprising depositing and patterning the ESL on the semiconductor layer, wherein depositing and patterning the ESL comprises a photolithographic and etching step, providing a carrier injection layer (103) arranged above the gate insulator layer (102), wherein the injection layer is deposited on the gate insulator layer, providing an S/D electrode layer (104) deposited on the carrier injection layer (103) and the semiconductor layer, patterning the injection layer and S/D electrode layer in one step, wherein patterning the injection layer and S/D electrode layer comprises a photolithographic and etching step, depositing a passivation layer (108) on the ESL and S/D electrode layer, forming a through hole in the TFT, depositing pixel electrode layer on the TFT followed by patterning the pixel electrode layer, wherein patterning pixel electrode layer comprises a photolithographic and etching step, wherein the TFT is patterned such that the semiconductor layer directly contacts the gate insulator layer (102), the carrier injection layer (103), and the S/D electrode layer (104). Typically, the semiconductor layer directly contacts the gate insulator layer (102), a side surface of the injection layer (103), and a side surface of the S/D electrode layer (104).

Such an embodiment comprises six steps of photolithography and etching. Accordingly 6 masks are used.

Typically, in such embodiment the injection layer has a thickness which is lower than the thickness of the semiconductor layer. Furthermore, the injection layer preferably does not contact the substrate averted surface of the semiconductor layer. Accordingly, the contact between the injection layer and the semiconductor layer is via a side surface of the injection layer. In case the thickness of the injection layer is lower than that of the semiconductor layer, the S/D electrode layer which is deposited on the injection layer also contacts the side surface of the semiconductor layer.

In particular embodiments, the S/D electrode layer additionally contacts the semiconductor layer at a substrate averted surface, thus resulting in a top contact configuration.

Of course, such TFT may also comprise a protection layer (105). In that case the above method comprises depositing the protection layer on the S/D electrode layer. Afterwards, injection layer, S/D electrode layer, and protection layer are patterned by photolithography and etching. Furthermore, the passivation layer (108) is deposited on the ESL and protection layer (105).

As the TFT and the method of production of TFTs in Bottom Gate and Top Contact configuration is technically more demanding, it is advantageous to produce a TFT in Bottom Gate and Bottom Contact configuration. The Bottom Gate and Top Contact configuration is technically more demanding because it requires an additional mask and etching step and higher temperature treatments, e.g., back-channel etching.

Thus, the present invention in particular relates to TFT in Bottom Gate and Bottom Contact configuration. In this connection, the semiconductor layer (104) is preferably deposited on the S/D electrode layer (104) or protection layer (105), if the TFT comprises a protection layer, in order to achieve a TFT in Bottom Contact configuration.

In a further aspect, the present invention relates to an electronic device comprising a TFT as disclosed herein or a TFT obtained from a method as disclosed herein.

In certain embodiments, the electronic device is an OLED, LED, sensor, TFT screen, RFID chip, or solar cell.

In another aspect, the present invention relates to the use of a TFT as disclosed herein or a TFT obtained from a method as disclosed herein for an electronic device.

In various embodiments, the electronic device is an OLED, LED, sensor, TFT screen, RFID chip, or solar cell.

Anhydrous compositions in the context of the present invention are those which contain less than 200 ppm of $H_2O$. Corresponding drying steps which lead to the establishment of correspondingly low water contents of solvents are known to those skilled in the art.

The term "about" means plus or minus 10% of the numerical value of the number with which it is being used. Therefore, about 50% means in the range of 40% to 60%.

The term "essentially consisting of" according to the present invention means that something consists to 80%, 90%, 95%, 99%, or 99.9% of the specified compound or composition. In case the term refers to the metal oxide layer the percentage is understood as weight % (w/w %). If a fluid phase or atmosphere is characterized the percentage specification refers to volume percent (vol.-%).

By "consisting of" is meant including, and limited to, whatever follows the phrase "consisting of". Thus, the phrase "consisting of" indicates that the listed elements are required or mandatory, and that no other elements may be present.

By "comprising" it is meant including, but not limited to, whatever follows the word "comprising". Thus, use of the term "comprising" indicates that the listed elements are required or mandatory, but that other elements are optional and may or may not be present.

The inventions illustratively described herein may suitably be practiced in the absence of any element or elements, limitation or limitations, not specifically disclosed herein. Thus, for example, the terms "comprising", "including", "containing", etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the inventions embodied therein herein disclosed may be resorted to by those skilled in the art, and that such modifications and variations are considered to be within the scope of this invention.

The invention has been described broadly and generically herein. Each of the narrower species and subgeneric groupings falling within the generic disclosure also form part of the invention. This includes the generic description of the invention with a proviso or negative limitation removing any subject matter from the genus, regardless of whether or not the excised material is specifically recited herein.

Other embodiments are within the following claims and non-limiting examples.

All documents cited herein, are hereby incorporated by reference in their entirety.

EXAMPLE

A coplanar structural thin film was employed comprising an injection layer of 15 nm ITO/source-drain electrode layer of 70 nm Al/a protection layer of 60 nm ITO, and a semiconductor layer of 10 nm InO.

Therefore, a substrate (100) was provided and the gate electrode layer (Mo/Al/Mo or Ti/Al/Ti stack) deposited thereon by sputtering. Afterwards, the gate electrode layer (101) was patterned by photolithography and etching. Then, the gate insulator layer (SiOx) was formed on the substrate and the gate electrode layer by CVD. Afterwards, a 15 nm ITO injection layer (103) was deposited on the gate insulator layer (102) by sputtering. In the next step, an S/D electrode layer (70 nm Al) was deposited by sputtering. Then, a 60 nm ITO protection layer (105) was deposited on the S/D electrode layer (104) by sputtering. The injection layer, S/D electrode layer, and protection layer were patterned in one step by photolithography and etching. Afterwards, a 10 nm Indium oxide semiconductor layer was deposited thereon by sputtering and patterned by photolithography and wet etching. Then, the passivation layer ($SiO_x$) was deposited thereon by CVD. A through hole was formed by photolithography and dry etching. In the next step, a ITO pixel electrode layer was deposited by sputtering and patterned by photolithography and a wet etching process.

For comparative experiments, a similar TFT was produced with the exception that no injection layer was formed.

The two TFTs were analyzed regarding their electronic properties. FIG. 8 shows that the on-current and the electron mobility of the thin film transistor of the present invention including an injection layer is much higher than of that without the injection layer.

The invention claimed is:

1. A thin film transistor (TFT) comprising a substrate with a gate electrode layer deposited and patterned thereon and a gate insulator layer deposited on the gate electrode layer and the substrate, wherein the TFT further comprises (i) a carrier injection layer arranged above the gate insulator layer, (ii) a source/drain (S/D) electrode layer deposited on the carrier injection layer, and (iii) a semiconductor layer, wherein the TFT is patterned such that the semiconductor layer directly contacts the gate insulator layer, the carrier injection layer and the S/D electrode layer.

2. The TFT according to claim 1, wherein the semiconductor layer is arranged above the carrier injection layer and the S/D electrode layer.

3. The TFT according to claim 1, wherein the TFT is in Bottom Gate and Bottom Contact configuration.

4. The TFT according to claim 1, wherein
the carrier injection layer is deposited on the gate insulator layer;
the TFT further comprises a protection layer, wherein the protection layer is deposited on the S/D electrode layer;
the TFT further comprises a protection layer, wherein the protection layer is deposited on the S/D electrode layer and the semiconductor layer is deposited and patterned on the protection layer;
the TFT further comprises a passivation layer, wherein the passivation layer is deposited on the semiconductor layer; and/or
the TFT further comprises a functionalization layer and a passivation layer, wherein the functionalization layer is deposited on the semiconductor layer and the passivation layer is deposited on the functionalization layer.

5. The TFT according to claim 1, wherein the semiconductor layer directly contacts a) the gate insulator layer a side surface of the carrier injection layer, and c) a side surface of the S/D electrode layer.

6. The TFT according to claim 5, wherein the contact of the semiconductor layer with the side surface of the S/D electrode layer occurs above the contact of the semiconductor layer with the side surface of the carrier injection layer.

7. The TFT according to claim 1, wherein
the semiconductor layer is not located underneath the S/D electrode layer or the injection layer;
the semiconductor layer is in contact with the substrate averted surface of the S/D electrode layer or if the TFT comprises a protection layer the semiconductor layer is in contact with the substrate averted surface of the protection layer;
the TFT comprises a protection layer, wherein the protection layer is arranged above S/D electrode layer;
the TFT further comprises a protection layer, wherein the protection layer is arranged above S/D electrode layer and wherein the semiconductor layer reaches from the gate insulator layer to above the protection layer;
the TFT further comprises a pixel electrode; and/or
the TFT comprises a pair of injection layers which are horizontally positioned within the TFT with equal distance relative to the substrate layer and wherein the two injection layers are separated from each other by the semiconductor layer and wherein the TFT comprises a pair of S/D electrode layers which are horizontally positioned within the TFT with equal distance relative to the substrate layer and wherein the two S/D electrode layers are separated from each other by the semiconductor layer, and wherein the pair of S/D electrode layers is positioned above and in direct contact with the pair of injection layers.

8. The TFT according to claim 1, wherein
the S/D electrode layer comprises a metal;
the S/D electrode layer has a thickness of 10 nm-1 μm;
the gate electrode layer comprises a metal;
the gate electrode layer has a thickness of 50 nm-500 nm;
the injection layer comprises a metal oxide conductor;
the injection layer has a thickness of 1 nm-200 nm;
the gate insulator layer comprises or consists of a metal oxide or -nitride or transition metal oxide or -nitride, or a polymeric material;
the gate insulator layer has a thickness of 10 nm-3 μm;
the substrate comprises glass, silicon, silicon dioxide, metal oxide, transition metal oxide, elementary metal or a polymeric material;
the substrate optionally has a thickness of 50 μm-0.7 mm;
the semiconductor layer comprises at least one metal oxide semiconductor selected from the group consisting of an indium, gallium, zinc, and tin oxide; and/or
the semiconductor layer has a thickness of 1-100 nm.

9. The TFT according to claim 1, wherein
the S/D electrode layer consists essentially of at least one metal selected from the group consisting of Al, Mo, Cu, Ag and Nd;
the gate electrode layer consists essentially of at least one metal selected from the group consisting of Al, Mo, Cu, and Nd;
the injection layer essentially consists of at least one metal oxide conductor selected from the group consisting of ITO, AZO, GZO, ATO, ZTO, IZO, IGO, AZTO, HIZO, GTZO, GTO, and FTO;
the semiconductor layer consists essentially of at least one metal oxide semiconductor selected from the group consisting of IGZO, ITZO, ITO, GZO, ZTO, IZO, IGO, AZO, AZTO, HIZO, GTZO, GTO, tin oxide ($SnO_2$), gallium oxide ($Ga_2O_3$), indium oxide ($In_2O_3$), and zinc oxide (ZnO); and/or
the semiconductor layer further comprises nitrogen, fluorine, chlorine, and/or silicon.

10. The TFT according to claim 1, wherein
the TFT further comprises a pixel electrode;
the protection layer comprises a metal oxide conductor, and/or a metal;
the protection layer has a thickness of 10 nm-500 nm;
the passivation layer comprises $SiO_x$ or $SiN_x$, with x=0.1 to 3; and/or
the protection layer essentially consists of at least one metal oxide conductor selected from the group consisting of ITO, AZO, GZO, ATO, ZTO, IZO, IGO, AZTO, HIZO, GTZO, GTO, and FTO.

11. A method of manufacture of a TFT comprising:
providing a substrate;
depositing and patterning a gate electrode on the substrate;
depositing a gate insulator layer on the gate electrode and the substrate;
wherein the method further comprises
providing a carrier injection layer arranged above the gate insulator layer,
providing a S/D electrode layer deposited on the carrier injection layer, and
providing a semiconductor layer, wherein the TFT is patterned such that the semiconductor layer directly contacts the gate insulator layer, the carrier injection layer, and the S/D electrode layer.

12. The method according to claim 11, wherein the semiconductor layer is arranged above the carrier injection layer and the S/D electrode layer.

13. The method according to claim 11, wherein the TFT is in Bottom Gate and Bottom Contact configuration.

14. The method according to claim 11, wherein
the provision of the carrier injection layer comprises depositing the carrier injection layer on the gate insulator layer;
the method further comprises providing a protection layer, wherein the protection layer is deposited on the S/D electrode layer;

the method further comprises providing a protection layer, wherein the protection layer is deposited on the S/D electrode layer and the semiconductor layer is deposited and patterned on the protection layer; and/or the method further comprises providing a passivation layer, wherein the passivation layer is deposited on the semiconductor layer; and/or the method further comprises providing a functionalization layer and a passivation layer, wherein the functionalization layer is deposited on the semiconductor layer and the passivation layer is deposited on the functionalization layer.

15. The method according to claim 11, wherein the semiconductor layer is provided such that it directly contacts a) the gate insulator layer, b) a side surface of the carrier injection layer, and c) a side surface of the S/D electrode layer.

16. The method according to claim 15, wherein the semiconductor layer is provided such that the contact of the semiconductor layer with the side surface of the S/D electrode layer occurs above the contact of the semiconductor layer with the side surface of the carrier injection layer.

17. The method according to claim 11, wherein
the semiconductor layer is provided such that the semiconductor layer is not located underneath the S/D electrode layer or the injection layer;
the semiconductor layer is provided such that the semiconductor layer is in contact with the substrate averted surface of the S/D electrode layer or if the TFT comprises a protection layer the semiconductor layer is in contact with the substrate averted surface of the protection layer;
the TFT comprises a protection layer, wherein the protection layer is arranged above S/D electrode layer;
the TFT further comprises a protection layer, wherein the protection layer is arranged above S/D electrode layer and wherein the semiconductor layer is provided such that the semiconductor layer reaches from the gate insulator layer to above the protection layer;
the method further comprises providing through hole; and/or
the method further comprises providing a pixel electrode.

18. The method according to claim 11, wherein
depositing and patterning of the gate electrode comprises photolithography and an etching process;
depositing the gate insulator layer on the gate electrode and the substrate comprises chemical vapor deposition (CVD);
the provision of the carrier injection layer comprises sputtering of the carrier injection layer;
the deposition of the S/D electrode layer on the carrier injection layer comprises sputtering of the S/D electrode layer;
patterning of the TFT comprises photolithography and etching of the injection layer and S/D electrode layer in one step;
the provision of the semiconductor layer comprises depositing of the semiconductor layer via sputtering, spin coating, or slot die coating;
the provision of the semiconductor layer comprises patterning of the semiconductor layer via photolithography and etching;
the deposition of the passivation layer and/or the functionalization layer comprises coating via CVD;
the through hole is formed by photolithography and etching;

the provision of the pixel electrode comprises deposition of the pixel electrode by sputtering; and/or
the provision of the pixel electrode comprises patterning of the deposited pixel electrode by photolithography and etching.

19. The method according to claim 11, wherein providing of the injection layer and the S/D electrode layer comprises patterning of the injection layer and S/D electrode layer by photolithography and etching resulting in the formation of a pair of injection layers and a pair of S/D electrode layers.

20. The method according to claim 19, wherein the method comprises the provision of the protection layer and providing of the injection layer the S/D electrode layer, and the protection layer comprises patterning of the injection layer, S/D electrode layer, and protection layer by photolithography and etching resulting in the formation of a pair of injection layers, a pair of S/D electrode layers, and a pair of protection layers.

21. The method according to claim 19, wherein
providing the semiconductor layer comprises depositing the semiconductor layer such that the pair of injection layers is separated from each other by the semiconductor layer and the pair of S/D electrode layers is separated from each other by the semiconductor layer, and wherein the pair of S/D electrode layers is positioned above and in direct contact with the pair of injection layers; or
providing the semiconductor layer comprises depositing the semiconductor layer such that the pair of injection layers is separated from each other by the semiconductor layer, that the pair of S/D electrode layers is separated from each other by the semiconductor layer, and that the pair of protection layers is separated from each other by the semiconductor layer, and wherein the pair of protection layers is positioned above and in direct contact with the pair of S/D electrode layers, and the pair of S/D electrode layers is positioned above and in direct contact with the pair of injection layers.

22. The method according to claim 18, wherein
the etching process to obtain the gate electrode layer, the pair of electrodes, the pair of injection layers, and the pair of protection layers is either dry or wet etching;
the etching process to obtain the semiconductor layer and the pixel electrode layer is wet etching; and/or
the etching process to form the through hole is dry etching.

23. The method according to claim 11, wherein
the S/D electrode layer or pair of S/D electrode layers comprises a metal;
the S/D electrode layer or pair of S/D electrode layers has a thickness of 1 nm-5 μm;
the gate electrode layer comprises a metal;
the gate electrode layer has a thickness of 50 nm-500 nm;
the injection layer or pair of injection layers comprises a metal oxide conductor;
the injection layer or pair of injection layers has a thickness of 1 nm-200 nm;
the gate insulator layer comprises a metal or transition metal oxide, or a polymeric material;
the gate insulator layer has a thickness of 10 nm-3 μm;
the substrate layer comprises glass, silicon, silicon dioxide, metal oxide, transition metal oxide, elementary metal or a polymeric material;
the substrate layer optionally has a thickness of 50 μm-0.7 mm;

the semiconductor layer comprises at least one metal oxide selected from the group consisting of an indium, gallium, zinc, and tin oxide;

the semiconductor layer has a thickness of 1-100 nm;

the protection layer or pair of protection layers comprises a metal oxide conductor, and/or a metal; and/or the protection layer or pair of protection layers has a thickness of 10 nm-500 nm.

24. The method according to claim 11, wherein the S/D electrode layer or pair of S/D electrode layers consists essentially of at least one metal selected from the group consisting of Al, Cu, Ag and Nd;

the gate electrode consists essentially of at least one metal selected from the group consisting of Al, Mo, Cu, Ti, and Nd or a stack or alloy thereof;

the injection layer or pair of injection layers consists essentially of at least one metal oxide conductor selected from the group consisting of ITO, AZO, GZO, ATO, ZTO, IZO, IGO, AZTO, HIZO, GTZO, GTO, and FTO;

the semiconductor layer consists essentially of at least one metal oxide semiconductor selected from the group consisting of IGZO, ITZO, ITO, GZO, ZTO, IZO, IGO, AZO, AZTO, HIZO, GTZO, GTO, tin oxide ($SnO_2$), gallium oxide ($Ga_2O_3$), indium oxide ($In_2O_3$), and zinc oxide (ZnO;

the semiconductor layer further comprises nitrogen, fluorine, chlorine, and/or silicon; and/or the protection layer or pair of protection layers consists essentially of at least one metal oxide conductor selected from the group consisting of ITO, AZO, GZO, ATO, ZTO, IZO, IGO, AZTO, HIZO, GTZO, GTO, and FTO.

25. An electronic device comprising a TFT according to claim 1.

26. The electronic device according to claim 25, wherein the device is an active matrix back plane for displays, OLED, LCD, EPD, sensor, TFT screen, RFID chip, or solar cell.

27. An electronic device comprising a TFT obtained from a method according to claim 11.

28. The electronic device according to claim 27 that is an active matrix back plane for displays, OLED, LCD, EPD, sensor, TFT screen, RFID chip, or solar cell.

* * * * *